United States Patent
Pang et al.

(10) Patent No.: US 9,595,342 B2
(45) Date of Patent: Mar. 14, 2017

(54) METHOD AND APPARATUS FOR REFRESH PROGRAMMING OF MEMORY CELLS BASED ON AMOUNT OF THRESHOLD VOLTAGE DOWNSHIFT

(71) Applicant: SanDisk Technologies Inc., Plano, TX (US)

(72) Inventors: Liang Pang, Fremont, CA (US); Yingda Dong, San Jose, CA (US); Jian Chen, San Jose, CA (US)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/600,365

(22) Filed: Jan. 20, 2015

(65) Prior Publication Data

US 2016/0211032 A1    Jul. 21, 2016

(51) Int. Cl.
*G11C 16/34* (2006.01)
*G11C 16/26* (2006.01)
*G11C 16/10* (2006.01)
*G11C 11/56* (2006.01)

(52) U.S. Cl.
CPC ...... *G11C 16/3431* (2013.01); *G11C 11/5621* (2013.01); *G11C 11/5671* (2013.01); *G11C 16/10* (2013.01); *G11C 16/26* (2013.01); *G11C 16/3418* (2013.01); *G11C 16/3459* (2013.01)

(58) Field of Classification Search
CPC .................................. G11C 16/3431
USPC ................................... 365/185.19
See application file for complete search history.

(56) References Cited

U.S. PATENT DOCUMENTS

| 5,835,413 | A  | * | 11/1998 | Hurter ............... G11C 11/5621 365/185.18 |
| 6,108,241 | A  | * | 8/2000 | Chevallier ......... G11C 11/5621 365/185.29 |
| 7,023,737 | B1 | * | 4/2006 | Wan .................... G11C 11/5628 365/185.22 |

(Continued)

OTHER PUBLICATIONS

U.S. Appl. No. 14/331,900, filed Jul. 15, 2014, "Reprogramming Memory With Single Program Pulse Per Data State," L. Pang et al.

(Continued)

*Primary Examiner* — Anthan Tran
*Assistant Examiner* — Mushfique Siddique
(74) *Attorney, Agent, or Firm* — Vierra Magen Marcus LLP

(57) ABSTRACT

Techniques are provided for periodically monitoring and adjusting the threshold voltage levels of memory cells in a charge-trapping memory device. When a criterion is met, such as based on the passage of a specified time period, the memory cells are read to classify them into different subsets according to an amount of downshift in threshold voltage (Vth). Two or more subsets can be used per data state. A subset can also comprise cells which are corrected using Error Correction Code (ECC) decoding. The subsets of memory cells are refresh programmed, without being erased, in which a Vth upshift is provided in proportion to the Vth downshift. The refresh programming can use a fixed or adaptive number of program pulses per subset. Some cells will have no detectable Vth downshift or a minor amount of Vth downshift which can be ignored. These cells need not be refresh programmed.

16 Claims, 23 Drawing Sheets

(56) References Cited

U.S. PATENT DOCUMENTS

| | | | |
|---|---|---|---|
| 7,508,704 B2* | 3/2009 | Honma | G06F 11/1072 365/185.02 |
| 7,508,713 B2* | 3/2009 | Sekar | G11C 8/08 365/185.17 |
| 7,773,414 B2 | 8/2010 | Hemink | |
| 7,986,559 B2* | 7/2011 | Lee | G11C 16/3454 365/185.19 |
| 8,885,411 B2* | 11/2014 | Kamigaichi | G11C 16/10 365/185.17 |
| 2005/0057968 A1* | 3/2005 | Lutze | G11C 16/349 365/185.18 |
| 2007/0171762 A1 | 7/2007 | Chen et al. | |
| 2008/0175054 A1 | 7/2008 | Hancock et al. | |
| 2009/0310414 A1* | 12/2009 | Lee | G11C 8/12 365/185.17 |
| 2010/0157671 A1* | 6/2010 | Mokhlesi | G11C 16/3431 365/185.03 |
| 2013/0070530 A1* | 3/2013 | Chen | G11O 5/063 365/185.11 |
| 2013/0077408 A1* | 3/2013 | Ueno | G11C 16/06 365/185.22 |
| 2014/0059396 A1* | 2/2014 | Matsuyama | G06F 11/0751 714/54 |
| 2014/0108705 A1* | 4/2014 | Gorobets | G11C 16/3431 711/103 |
| 2014/0119128 A1* | 5/2014 | Hendrickson | G11C 11/5642 365/185.21 |
| 2014/0219027 A1* | 8/2014 | Dong | G11C 16/3427 365/185.17 |
| 2014/0281768 A1 | 9/2014 | Hung et al. | |

OTHER PUBLICATIONS

U.S. Appl. No. 14/331,784, filed Jul. 15, 2014, "Multiple Pass Programming for Memory With Different Program Pulse Widths," L. Pang et al.

International Search Report & The Written Opinion of the International Searching Authority dated Feb. 24, 2016, International Application No. PCT/US2015/061441.

* cited by examiner

Code in storage device (150)

boot code (151)

control code / set of instructions (160)

instructions for programming a set of memory cells to a plurality of target data states (161)

instructions for sensing and refresh programming the set of memory cells after the programming and during a time period in which the set of memory cells are not erased (162)

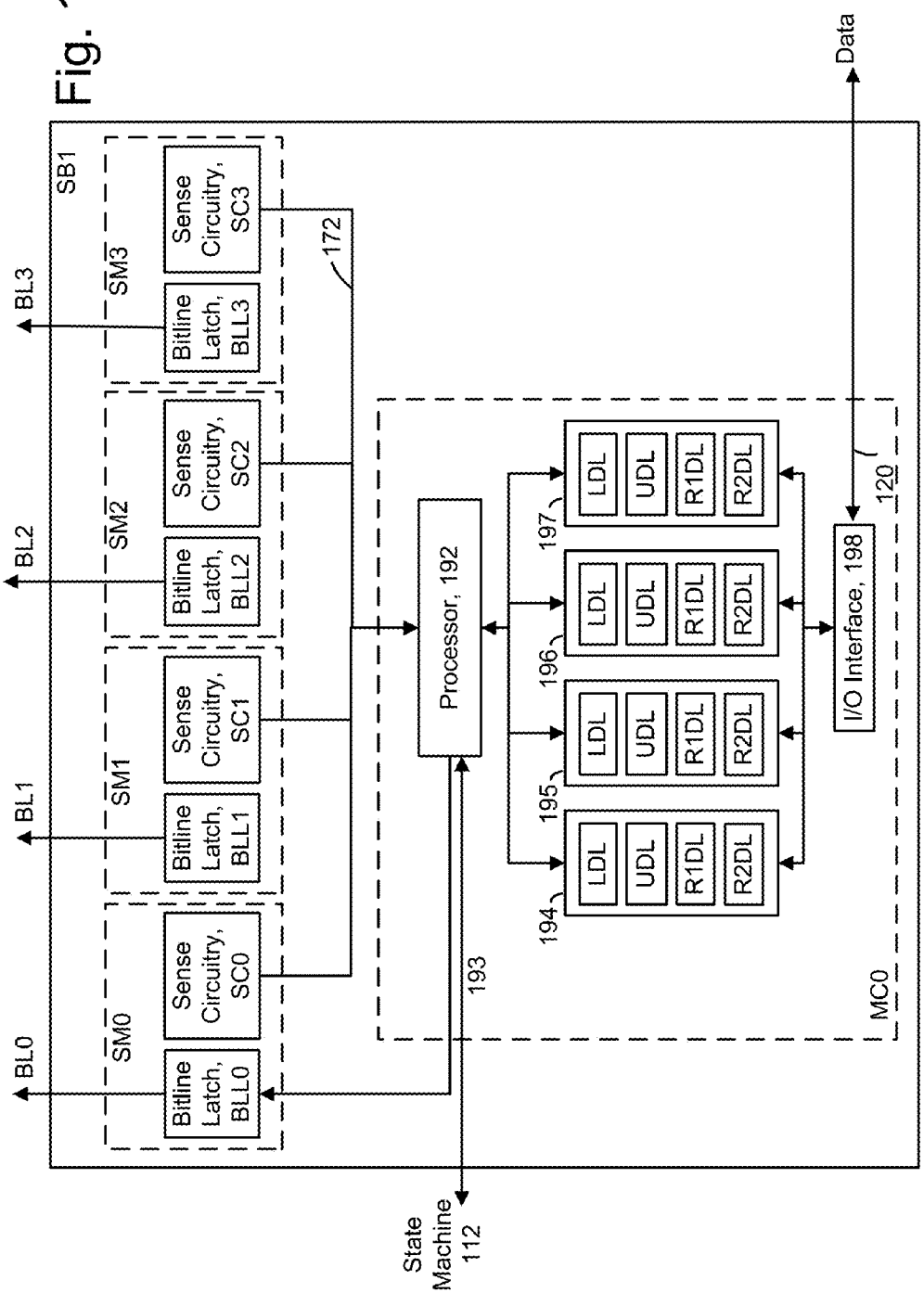

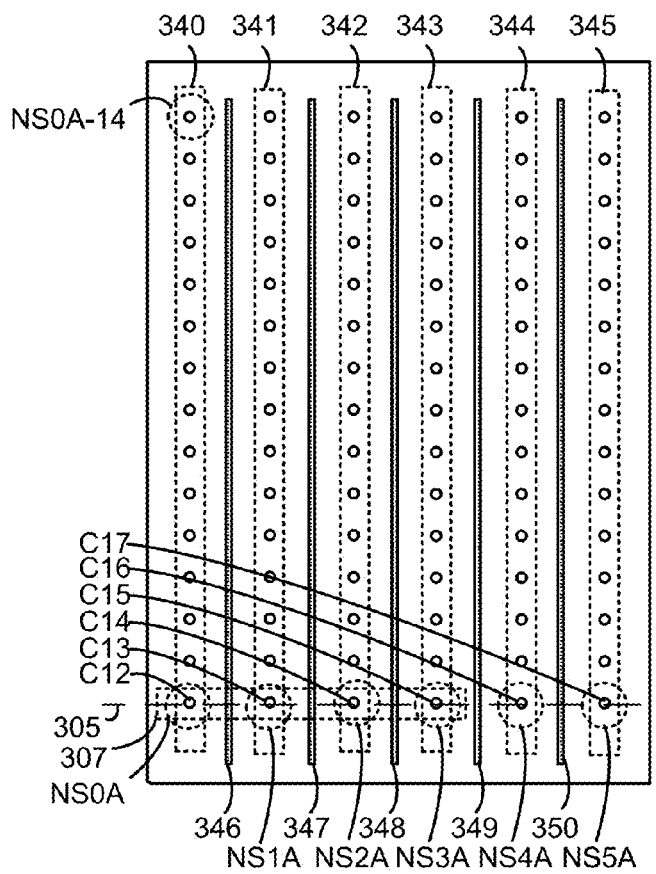
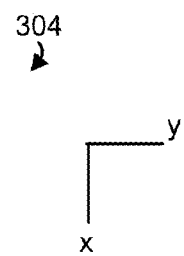
Fig. 3A
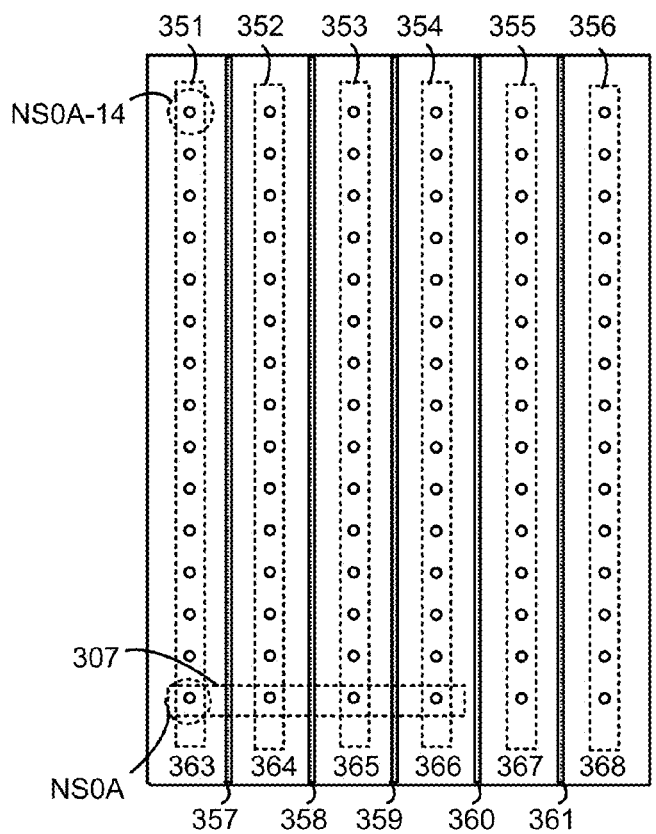
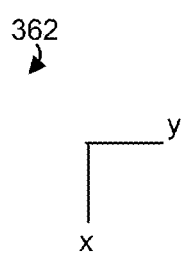
Fig. 3B

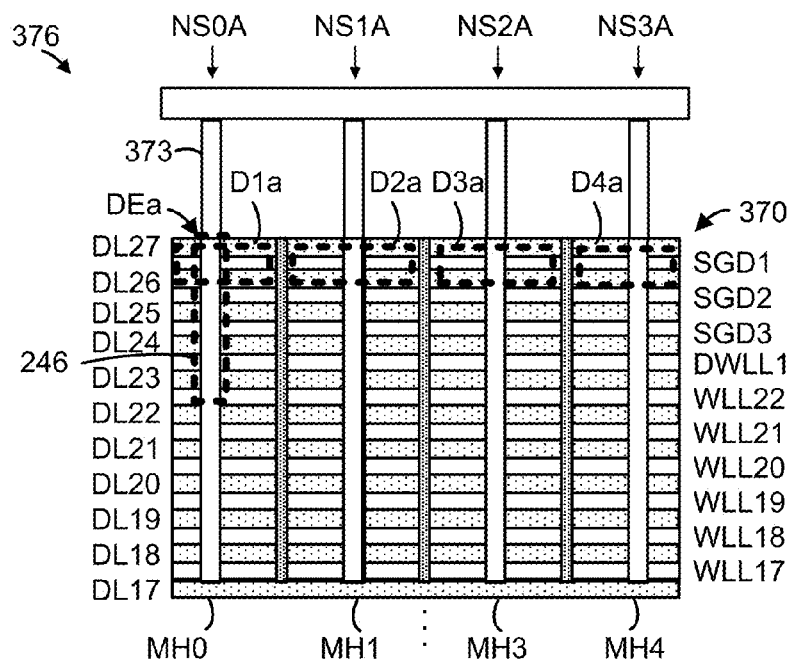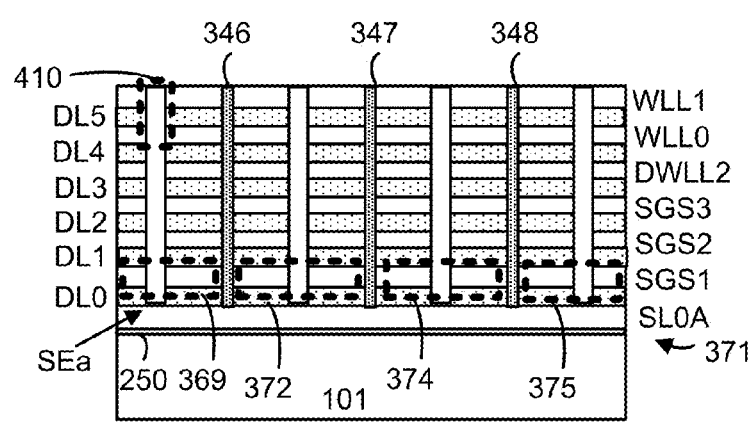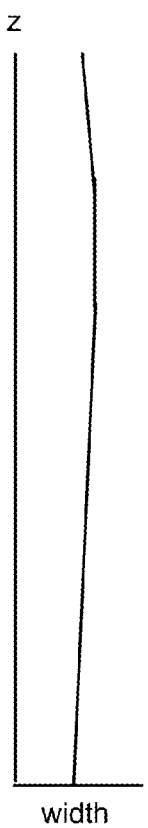
Fig. 3C1
Fig. 3C2

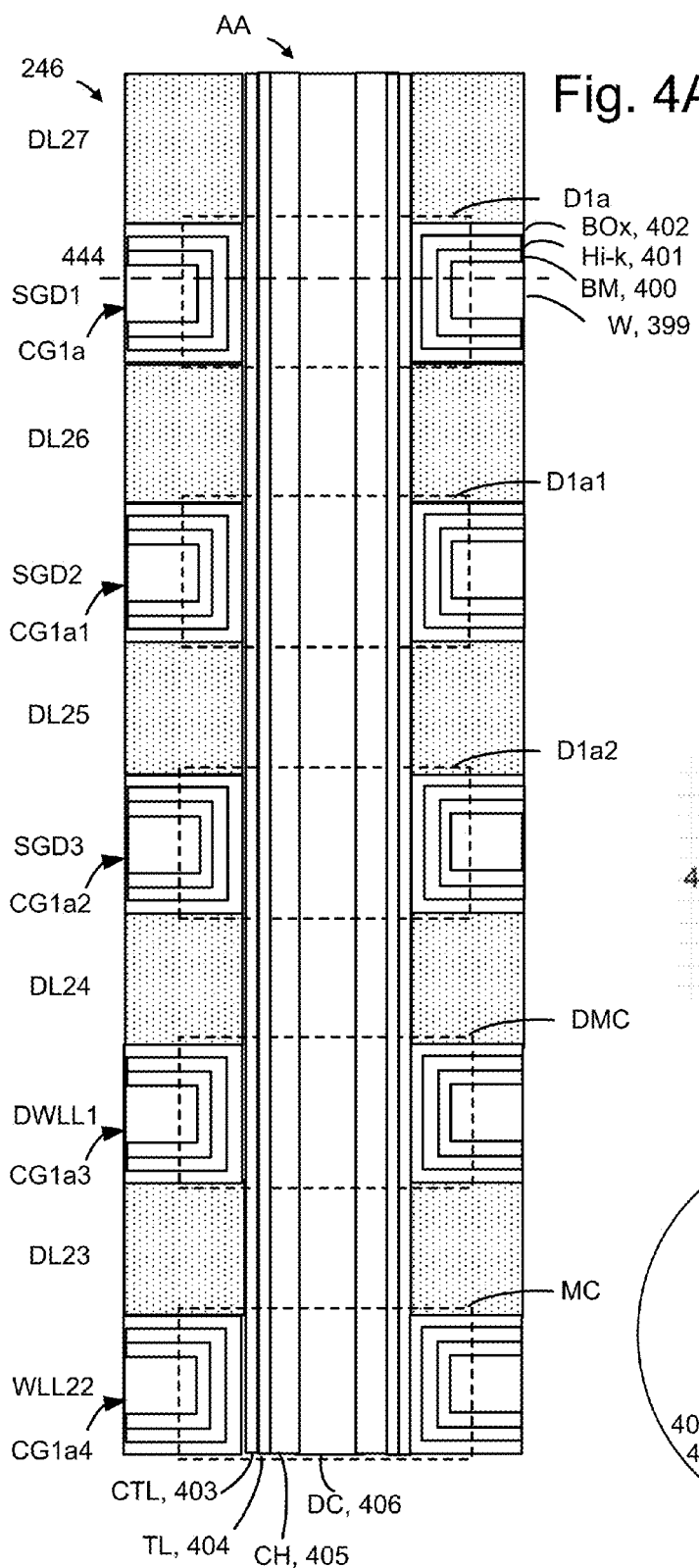
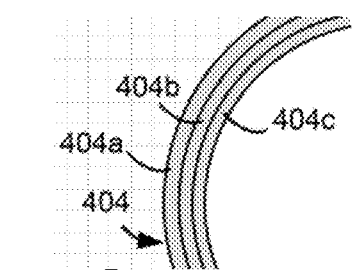
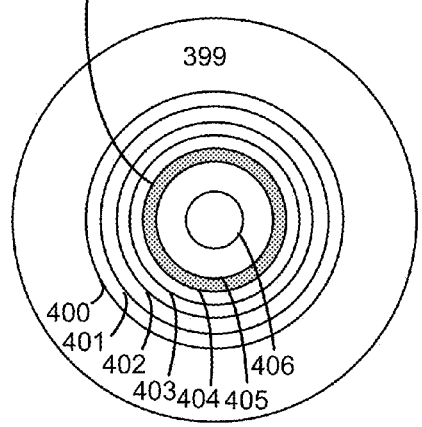

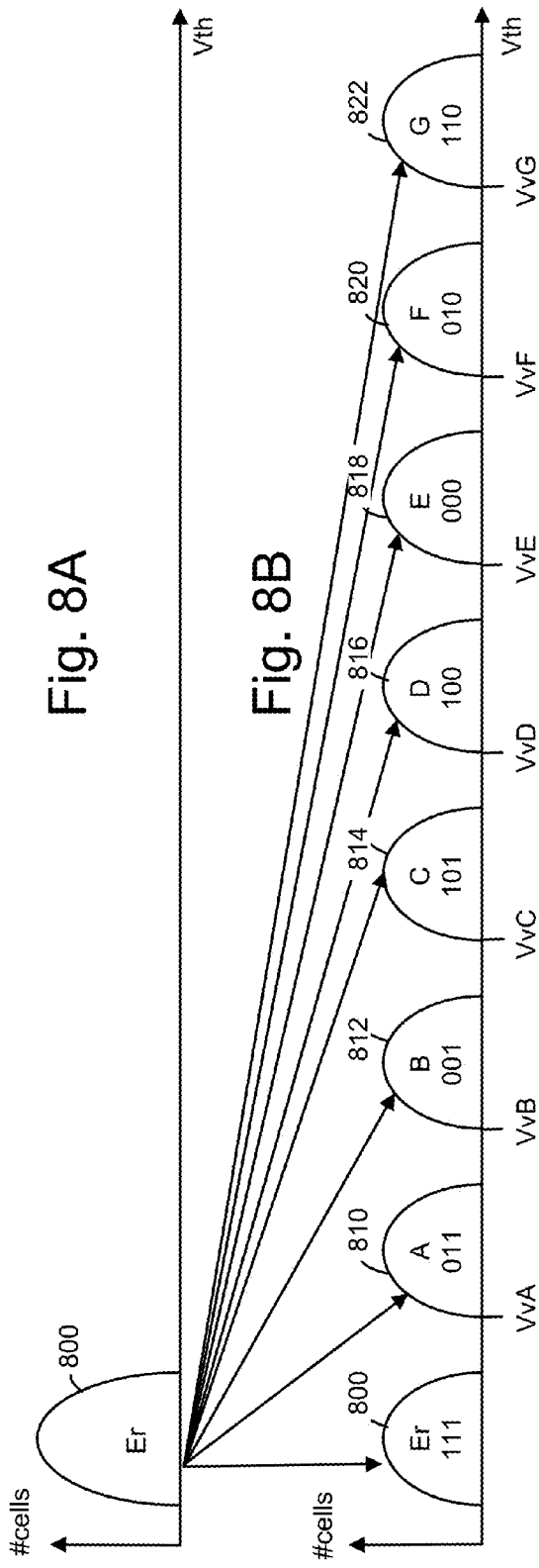

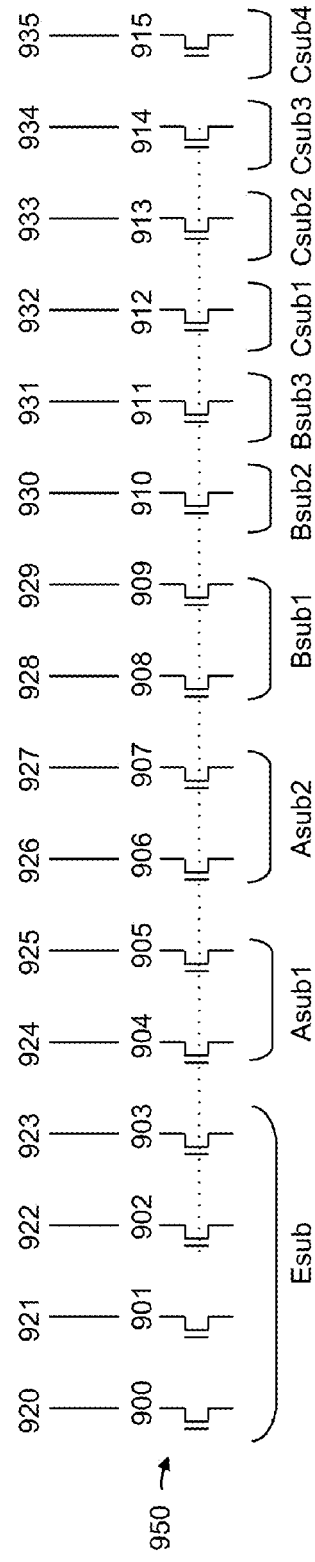

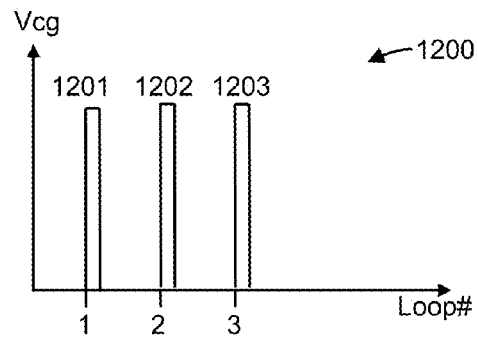
Fig. 12A1
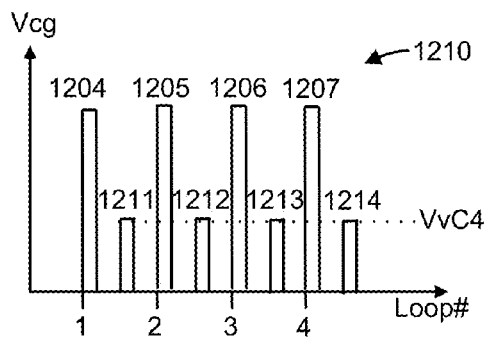
Fig. 12A2
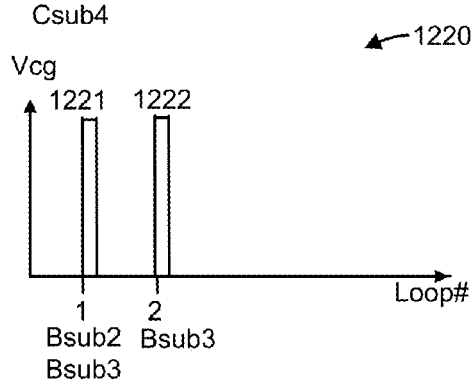
Fig. 12B
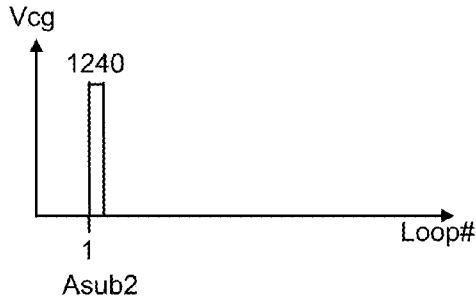
Fig. 12C Fig. 13A
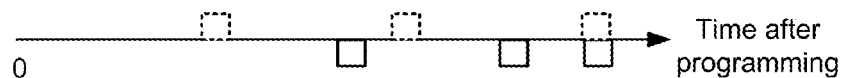
Fig. 13B
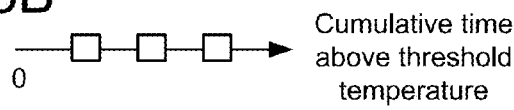
Fig. 13C
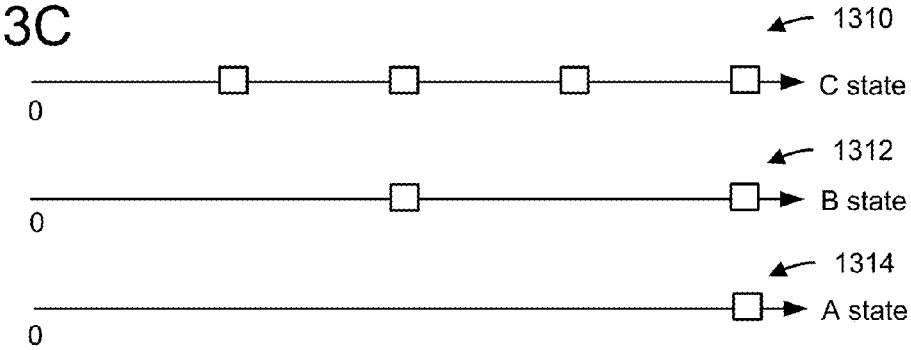
Fig. 14A        Fig. 14B
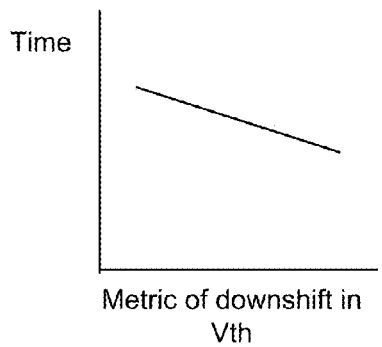   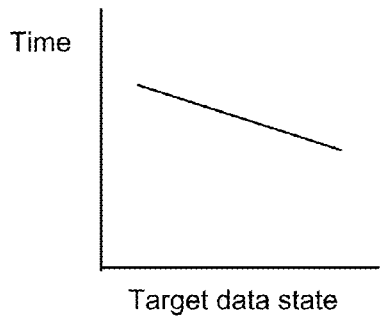
Fig. 14C
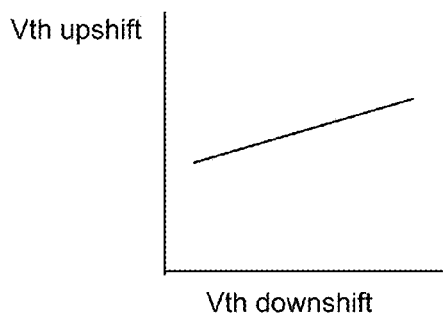

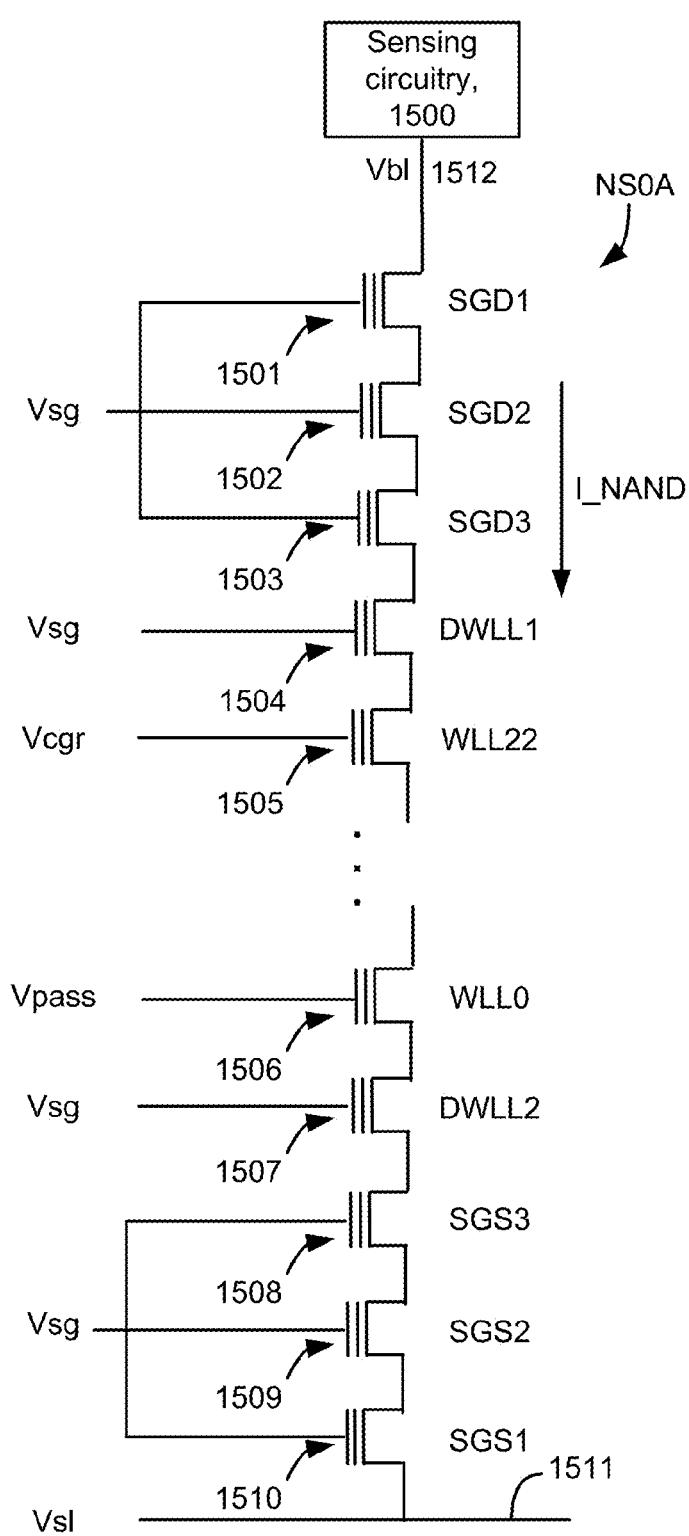
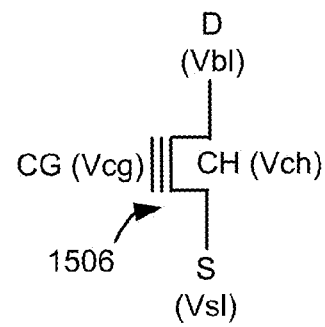
Fig. 15A
Fig. 15B

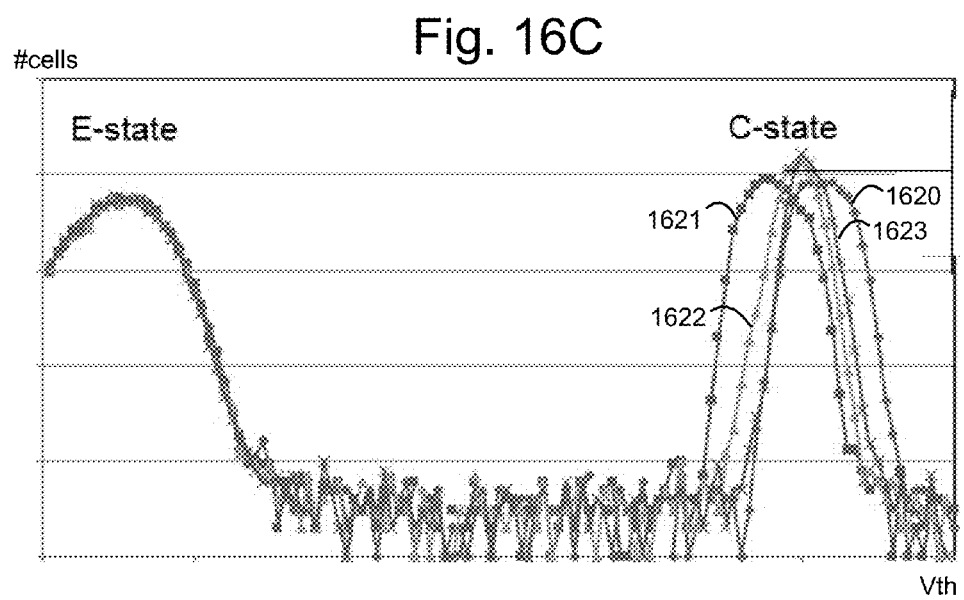

us 9,595,342 B2

METHOD AND APPARATUS FOR REFRESH PROGRAMMING OF MEMORY CELLS BASED ON AMOUNT OF THRESHOLD VOLTAGE DOWNSHIFT

BACKGROUND

The present technology relates to operation of memory devices.

A charge-trapping material can be used in memory devices to store a charge which represents a data state. The charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers. A memory hole is formed in the stack and a NAND string is then formed by filling the memory hole with materials including a charge-trapping layer. A straight NAND string extends in one memory hole, while a pipe- or U-shaped NAND string (P-BiCS) includes a pair of vertical columns of memory cells which extend in two memory holes and which are joined by a bottom back gate. Control gates of the memory cells are provided by the conductive layers.

However, various challenges are presented in operating such memory devices.

BRIEF DESCRIPTION OF THE DRAWINGS

Like-numbered elements refer to common components in the different figures.

FIG. 1E is a block diagram depicting one embodiment of the sense block SB1 of FIG. 1B.

FIG. 3A depicts a top view of an example word line layer 304 of the block BLK0 of FIG. 1A, in a straight NAND string embodiment.

FIG. 3B depicts a top view of an example SGD layer 362, consistent with FIG. 3A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided.

FIG. 3C2 depicts a variation in the width of a memory hole along its height.

FIG. 4A depicts a view of the region 246 of FIG. 3C1, showing SGD transistors D1a (consistent with FIG. 3C1), D1a1 and D1a2 above a dummy memory cell (DMC) and a data-storing memory cell (MC).

FIG. 4B1 depicts a cross-section view of the region 246 of FIG. 4A along line 444.

FIG. 4B2 depicts a close-up view of the tunneling layer 404 of FIG. 4B1, showing an oxide 404a, nitride 404b, oxide 404c configuration.

FIG. 6A depicts a process for operating a memory device in which a full programming operation is followed by a refresh programming operation.

FIG. 6B depicts a process for performing sensing operations consistent with step 603 of FIG. 6A.

FIGS. 8A and 8B depict a one-pass full programming operation with eight data states, consistent with step 600 of FIG. 6A.

FIG. 8C depicts the Vth distributions of FIG. 8B with Vth downshifts due to charge loss, and control gate voltages used in the sensing of Vth ranges of different subsets of memory cells, consistent with step 603 of FIG. 6A.

FIG. 9 depicts example subsets of memory cells which are classified according to their target data state and an amount of Vth downshift.

FIG. 10A depicts an example of bit combinations in data latches during a full programming operation consistent with step 600 of FIG. 6A.

FIG. 10B depicts an example of bit combinations in data latches after a sensing operation which classifies the memory cells into subsets, and before a refresh programming operation, consistent with FIG. 6A.

FIG. 12A1 depicts voltages applied to a word line in an example refresh programming operation consistent with step 604b of FIG. 6A, where a fixed number of program pulses are applied to refresh program subsets of C state memory cells.

FIG. 12A2 depicts voltages applied to a word line in an example refresh programming operation consistent with steps 604a and 604b of FIG. 6A, where a fixed number of program pulses are applied to refresh the subsets Csub2 and Csub3 of the C state memory cells, and one or more program pulses are applied until a verify test is passed for the subset Csub3 of the C state memory cells.

FIG. 12B depicts voltages applied to a word line in an example refresh programming operation consistent with step 604b of FIG. 6A, where a fixed number of program pulses are applied to refresh program subsets of B state memory cells.

FIG. 12C depicts voltages applied to a word line in an example refresh programming operation consistent with step 604b of FIG. 6A, where a fixed number of program pulses are applied to refresh program a subset of A state memory cells.

FIG. 13A depicts a timeline showing times when a data retention check is performed as a function of a time after completion of a full programming operation.

FIG. 13B depicts a timeline showing times when a data retention check is performed as a function of a cumulative time above a threshold temperature.

FIG. 13C depicts timelines showing times when a data retention check is performed as a function of a time after completion of a full programming operation, where memory cells of different target data states are refresh programmed in different refresh programming operations.

FIG. 14A is plot showing a time until a next data retention check as a function of a metric of a downshift in Vth, consistent with decision step 601 of FIG. 6A.

FIG. 14B is plot showing a time until a next data retention check as a function of a target data state, consistent with decision step 601 of FIG. 6A and with FIG. 13C.

FIG. 14C is plot showing a Vth upshift during refresh programming as a function of a sensed Vth downshift, for an example subset of memory cells, consistent with step 604 of FIG. 6A.

FIG. 15A depicts a circuit diagram of a NAND string consistent with the memory devices of FIGS. 2C and 3C1.

FIG. 15B depicts a circuit diagram of the memory cell 1506 of FIG. 15A.

FIG. 16C depicts test data of a set of memory cells in the erased state and the C state, showing an initial Vth distribution 1620 immediately after programming, a downshifted Vth distribution 1621, a Vth distribution 1622 after refresh programming using one program pulse, and a Vth distribution 1623 after refresh programming using two program pulses.

DETAILED DESCRIPTION

Figure 1A:
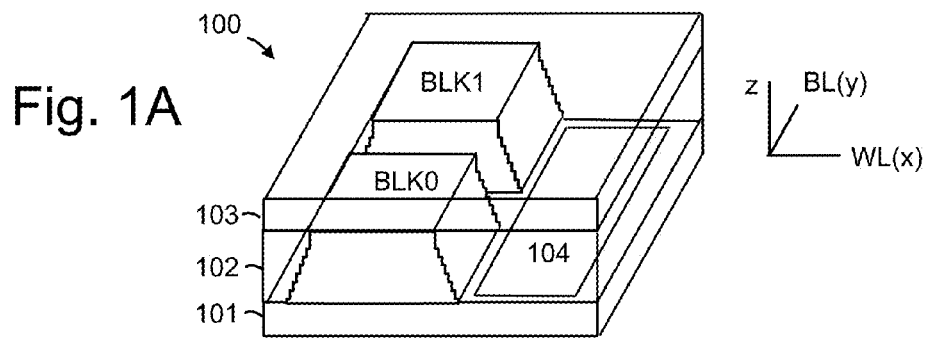
FIG. 1A is a perspective view of a 3D stacked non-volatile memory device.

Techniques are provided for monitoring and adjusting the threshold voltage levels of memory cells in charge-trapping memory.

A charge-trapping memory device may use a charge-trapping material such as silicon nitride or other nitride, or in a multi-layer configuration such as an oxide-nitride-oxide (O—N—O) configuration. The charge-trapping material is separated from a channel layer by a tunneling layer. For example, a charge-trapping memory device may be a 3D memory device in which a stack of alternating conductive and dielectric layers are formed. Memory holes are etched in the stack and films are deposited in the holes such that memory cells or select gate transistors are formed where the conductive layers intersect with the memory holes. The films include a charge-trapping layer which extends vertically along an individual cell or an entire NAND string, a tunneling layer and a channel layer. Some of the conductive layers are used as control gates for memory cells and other conductive layers are used as control gates for select gate transistors, such as drain or source side transistors in NAND strings. Another example of a charge-trapping memory device is a 2D memory device in which the charge-trapping layer extends horizontally along a NAND string.

However, charge loss in such memory cells after they are programmed can be significant. This loss is caused by charge detrapping from shallow traps in the tunnel ONO layers of the memory cells. Charge-trapping memory cells are particularly susceptible to charge loss as compared to floating gate memory cells. As a result of the charge loss, the threshold voltage (Vth) of a memory cell can decrease to the point where its data state cannot be accurately read back. This is in conflict with the need to provide reliable long-term data storage.

One option is to periodically perform a full reprogramming of the memory cells. In this approach, the memory cells are read to obtain the original write data, erased and programmed from the erased state to a number of target data states which correspond to the write data. However, this approach essentially repeats the original programming and involves many program loops which expose the memory cells to additional program disturb, especially erased state-to A state disturbs. Additionally, the process is time consuming.

One solution is to perform an in-place refresh programming. In this approach, a data retention check is performed in which the memory cells are read to identify cells which have experienced a Vth downshift. The memory cells are classified into different subsets (e.g., adjacent and non-overlapping subsets) according to the amount of the Vth downshift. A refresh programming then occurs in which the Vth is upshifted by an amount which is proportional to the Vth downshift. In this approach, the amount of refresh programming is tailored to different subsets of memory cells based on the amount of Vth downshift. The number of subsets for each data state can be relatively small to minimize complexity. This approach is particularly suitable when data is stored for a relatively long period, e.g., months or years, in a cold storage application. Such data is stored once and read many times over a period of time in which charge loss can be significant. The refresh programming can be performed for any unit of memory cells, e.g., a single cell, a portion of a word line, an entire word line, or a block. The refresh programming can use a fixed or adaptive number of program pulses per subset. Moreover, some cells will have no detectable Vth downshift or a minor amount of Vth downshift which can be ignored. These cells need not be refresh programmed.

The subsets which are subject to refresh programming can be configured differently for different data states. For example, in some cases, the memory cells with a relatively higher data state will experience relatively larger Vth downshifts. The number of subsets per data state and the size of the subsets can be customized for each data state. Further, a size of a Vth downshift which is considered minor and not subject to refresh programming can be customized for each data state. Moreover, in one option, a subset is defined for memory cells of a data state which are corrected by Error Correction Code (ECC) decoding.

In one aspect, the data retention check (comprising reading and refresh programming) is initiated when a criterion is met. For example, the criterion can include the passage of a specified time period since the memory cells were programmed. The criterion can include an amount of time in which a temperature of the memory device exceeds a threshold temperature. The criterion can include whether the memory device has reached a specified number of program-erase (PE) cycles, as tracked by a PE counter, for instance.

Another option is to set the time for a subsequent data retention check based on a metric which indicates an amount of Vth downshift in a prior data retention check, where the time is relatively sooner when the amount of Vth downshift is relatively greater. Another option is to decide whether to perform a data retention check for memory cells of a lower data state based on an amount of Vth downshift which is seen in cells of a higher data state. Another option is to perform a data retention check for different data states at different times and/or frequencies. Various other options are possible as well.

These solutions can avoid program disturb, thereby allowing the data retention checks to be performed more frequently. This can increase the endurance of the memory device. Moreover, Vth distributions can be narrowed to reduce the likelihood of uncorrectable read errors.

The following discussion provides details of the construction of example memory devices and of related techniques which address the above and other issues.

FIG. 1A is a perspective view of a 3D stacked non-volatile memory device. The memory device 100 includes a substrate 101. On the substrate are example blocks BLK0 and BLK1 of memory cells and a peripheral area 104 with circuitry for use by the blocks. The substrate 101 can also carry circuitry under the blocks, along with one or more lower metal layers which are patterned in conductive paths to carry signals of the circuitry. The blocks are formed in an intermediate region 102 of the memory device. In an upper region 103 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While two blocks are depicted as an example, additional blocks can be used, extending in the x- and/or y-directions.

In one possible approach, the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device.

Figure 1B:
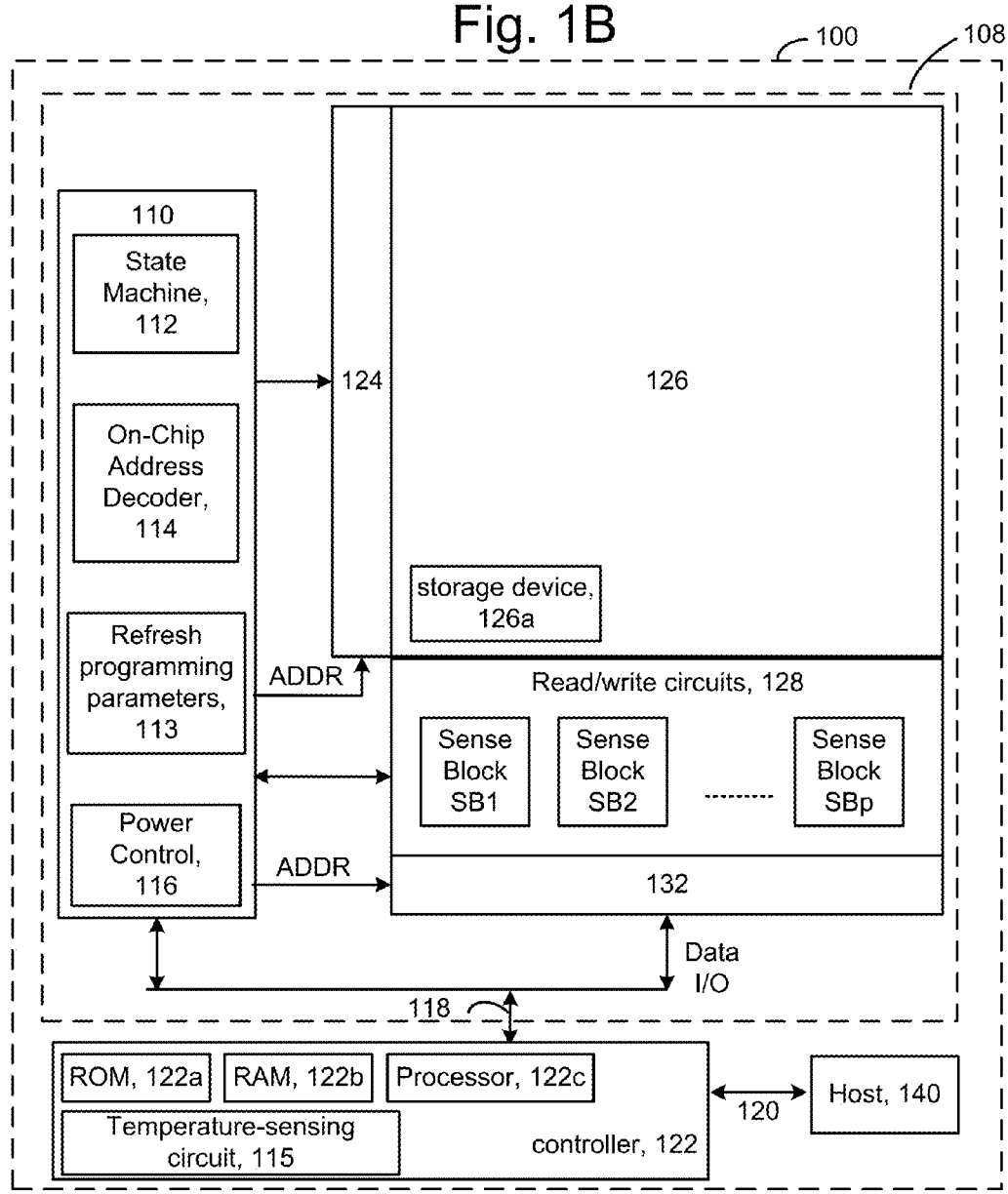
FIG. 1B is a functional block diagram of a memory device such as the 3D stacked non-volatile memory device 100 of FIG. 1A.

FIG. 1B is a functional block diagram of a memory device such as the 3D stacked non-volatile memory device 100 of FIG. 1A. The memory device 100 may include one or more memory die 108. The memory die 108 includes a memory structure 126 of memory cells, such as an array of memory cells, control circuitry 110, and read/write circuits 128. In a 3D configuration, the memory structure can include the blocks BLK0 and BLK1 of FIG. 1A. The memory structure 126 is addressable by word lines via a row decoder 124 and by bit lines via a column decoder 132. The read/write circuits 128 include multiple sense blocks SB1, SB2, . . . , SBp (sensing circuitry) and allow a page of memory cells to be read or programmed in parallel. Typically a controller 122 is included in the same memory device 100 (e.g., a removable storage card) as the one or more memory die 108. Commands and data are transferred between the host 140 and controller 122 via a data bus 120 and between the controller and the one or more memory die 108 via lines 118.

The memory structure can be 2D or 3D. The memory structure may comprise one or more array of memory cells including a 3D array. The memory structure may comprise a monolithic three dimensional memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114, and a power control module 116. The state machine 112 provides chip-level control of memory operations. A storage region 113 may be provided for parameters for a refresh programming operation as described herein.

The controller 122 may also include a temperature-sensing circuit 115 which is used by the processor 122c to provide an ambient temperature of the memory device. The temperature can be used, e.g., to determine whether a criterion is met to perform a refresh programming process, as discussed further below. See also FIG. 13B.

Figures 1C, 1D:
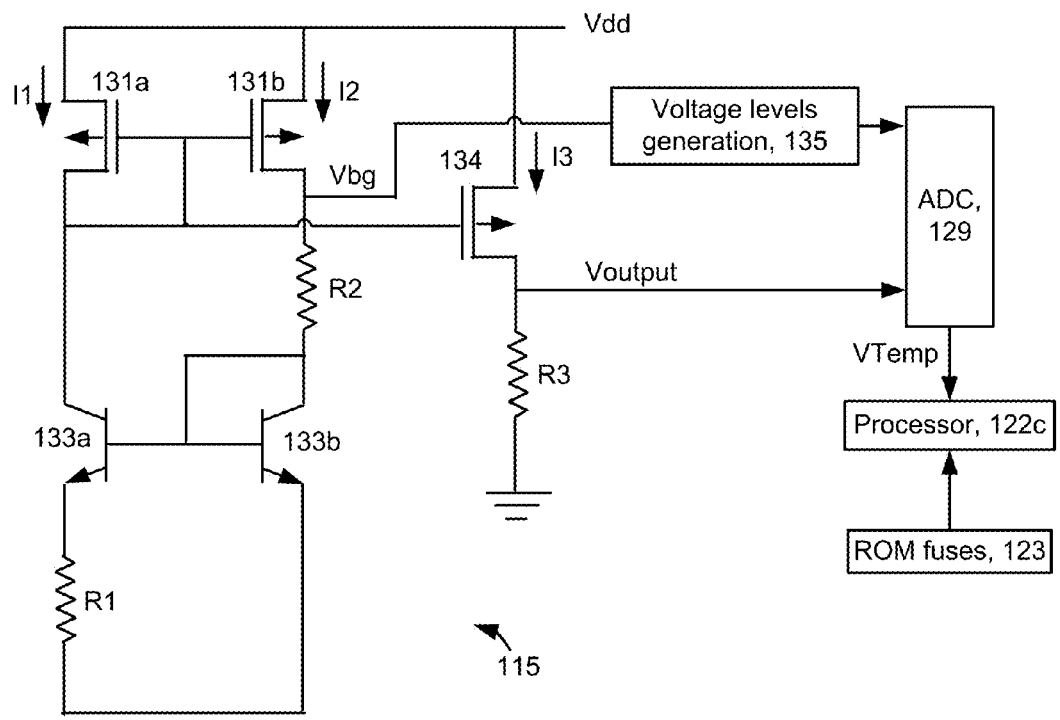
FIG. 1C depicts an example of the temperature-sensing circuit 115 of FIG. 1B.
FIG. 1D depicts code which may be executed by a processor.

FIG. 1C depicts an example of the temperature-sensing circuit 115 of FIG. 1B. The circuit includes pMOSFETs 131a, 131b and 134, bipolar transistors 133a and 133b and resistors R1, R2 and R3. I1, I2 and I3 denote currents. Voutput is a temperature-based output voltage provided to an analog-to-digital (ADC) converter 129. Vbg is a temperature-independent voltage. A voltage level generation circuit 135 uses Vbg to set a number of voltage levels. For example, a reference voltage may be divided down into several levels by a resistor divider circuit.

The ADC compares Voutput to the voltage levels and selects a closest match among the voltage levels, outputting a corresponding digital value (VTemp) to the processor. This is data indicating a temperature of the memory device. ROM fuses 123 store data which correlates the matching voltage level to a temperature, in one approach. The processor then uses the temperature to set temperature-based parameters in the memory device.

Vbg, is obtained by adding the base-emitter voltage (Vbe) across the transistor 131b and the voltage drop across the resistor R2. The bipolar transistor 133a has a larger area (by a factor N) than the bipolar transistor 133b. The pMOSFETs 131a and 131b are equal in size and are arranged in a current mirror configuration so that the currents I1 and I2 are substantially equal. We have $Vbg=Vbe+R2 \times I2$ and $I1=Ve/R1$ so that $I2=Ve/R1$. As a result, $Vbg=Vbe+R2 \times kT \ln(N)/R1 \times q$, where T is temperature, k is Boltzmann's constant and q is a unit of electric charge. The source of the pMOSFET 134 is connected to a supply voltage Vdd and the node between the transistor's drain and the resistor R3 is the output voltage, Voutput. The gate of the transistor 134 is connected to the same terminal as the gates of pMOSFETs 131a and 131b and the current through the pMOSFET 134 mirrors the current through the pMOSFETs 131a and 131b.

Referring again to FIG. 1B, the on-chip address decoder 114 provides an address interface between that used by the host or a memory controller to the hardware address used by the decoders 124 and 132. The power control module 116 controls the power and voltages supplied to the word lines and bit lines during memory operations. It can includes drivers for word line layers (WLLs) in a 3D configuration, SGS and SGD transistors and source lines. The sense blocks can include bit line drivers, in one approach. An SGS transistor is a select gate transistor at a source end of a NAND string, and an SGD transistor is a select gate transistor at a drain end of a NAND string.

In some implementations, some of the components can be combined. In various designs, one or more of the components (alone or in combination), other than memory structure 126, can be thought of as at least one control circuit which is configured to perform the actions described herein. For example, a control circuit may include any one of, or a combination of, control circuitry 110, state machine 112, decoders 114/132, power control module 116, sense blocks SB1, SB2, . . . , SBp (including the processor 192 and managing circuit MC0 in FIG. 1E), read/write circuits 128, and controller 122, and so forth. The sense block SB1 is discussed further in connection with FIG. 1E.

The off-chip controller 122 may comprise a processor 122c and storage devices (memory) such as ROM 122a and RAM 122b. The storage devices comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, FIG. 1D depicts code which may be executed by the processor 122c. The code 150 is used by the controller to access the memory structure such as for programming, read and erase operations. The code can include boot code 151 and control code (set of instructions) 160. The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

The control code further includes instructions for programming a set of memory cells to a plurality of target data states (161), and instructions for sensing and refresh programming the set of memory cells after the programming and during a time period in which the set of memory cells are not erased (162). Generally, the control code can include instructions to perform the functions described herein including the steps of the processes of FIGS. 6A, 6B and 6C.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements. The columns may be arranged in a two dimensional configuration, e.g., in an x-y plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the two dimensional and three dimensional exemplary structures described but covers all relevant memory structures within the spirit and scope of the technology as described herein and as understood by one of skill in the art.

FIG. 1E is a block diagram depicting one embodiment of the sense block SB1 of FIG. 1B. The sense block is partitioned into one or more core portions, referred to as sense modules (e.g., SM0) or sense amplifiers, and a common portion, referred to as a managing circuit (e.g., MC0). In one embodiment, there is a separate sense module for each bit line and one common managing circuit for a set of sense modules, such as SM0, SM1, SM2 and SM3. Each of the sense modules in a group communicates with the associated managing circuit via a data bus 172. Thus, there are one or more managing circuits which communicate with the sense modules of a set of memory cells.

Each sense module SM0, SM1, SM2 and SM3 comprises sense circuitry SC0, SC1, SC2 and SC3, respectively, that performs sensing by determining whether a conduction current in a connected bit line BL0, BL1, BL2 and BL3, respectively, is above or below a predetermined threshold voltage (verify voltage). Each sense module SM0, SM1, SM2 and SM3 also includes a bit line latch BLL0, BLL1, BLL2 and BLL3, respectively, that is used to set a voltage condition on the connected bit line. For example, during a programming voltage, a predetermined state latched in a bit line latch will result in the connected bit line being pulled to a lockout state (e.g., 1.5-3 V), a slow programming state (e.g., 0.5-1 V) or a normal programming state (e.g., 0 V).

Managing circuit MC0 comprises a processor 192, four example sets of data latches 194, 195, 196 and 197 and an I/O interface 198 coupled between the sets of data latches and the data bus 120. One set of data latches can be provide for each sense module, and may include data latches identified by LDL, UDL, Rlsb and Rmsb. LDL stores a bit for a lower page (LP) of write data, and UDL stores a bit for an upper page (UP) of write data, in a memory which stores two bits of data in each memory cell. Rlsb stores a least significant bit which identifies a subset for a refresh programming operation, and Rmsb stores a most significant bit which identifies a subset for a refresh programming operation. Rlsb and Rmsb together define four possible bit combinations (00, 01, 10 and 11) which can identify as many as four subsets for a data state. See also FIGS. 10A and 10B.

Additional data latches could be used as well. For example, in a three-bit per memory cell implementation, one extra data latch may be used to store a middle page (MP) of data. A four-bit per memory cell implementation can use lower-middle and upper-middle data latches. The techniques provided herein are meant to encompass such variations. In a further option, another latch is used to identify whether a memory cell is in a slow programming mode when its Vth is within a specified margin of the verify voltage of its target data state.

The processor 192 performs computations during reading and programming. For reading, the processor determines the data state stored in the sensed memory cell and stores the data in the set of data latches. For full programming and refresh programming, the processor reads the latches to determine the data state which is to be written to a memory cell.

During reading, the operation of the system is under the control of the state machine 112 which controls the supply of different control gate voltages to the addressed memory cell. As it steps through the various predefined control gate voltages (e.g., VrEr/A, VrA/B and VrB/C in FIG. 7B) corresponding to the various memory states supported by the memory (e.g., states A, B and C), the sense module may trip at one of these voltages and a corresponding output will be provided from the sense module to the processor 192 via the data bus 172. At that point, processor 192 determines the memory state by consideration of the tripping event(s) of the sense module and the information about the applied control gate voltage from the state machine via input lines 193. It then computes a binary encoding for the memory state and stores the resultant data bits into the sets of data latches 194-197. In another embodiment of the managing circuit MC0, the bit line latch serves both as a latch for latching the output of the sense module and also as a bit line latch as described above.

Some implementations can include multiple processors. In one embodiment, each processor will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with four sense modules, the state machine needs to read the wired-OR line four times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LP and UP data latches. The programming operation, under the control of the state machine, comprises a series of programming voltage pulses applied to the control gates of the addressed memory cells. Each programming voltage is followed by a read back (verify) to determine if the memory cell has been programmed to the desired memory state. In some cases, processor monitors the read back memory state relative to the desired memory state. When the two states agree, the processor sets the bit line latch to cause the bit line to be pulled to a state designating program inhibit (e.g., 2-3 V). This inhibits the memory cell coupled to the bit line from further programming even if programming voltages appear on its control gate. In other embodiments, the processor initially loads the bit line latch and the sense circuitry sets it to an inhibit value during the verify process.

Each set of data latches 194-197 may be implemented as a stack of data latches for each sense module. In one embodiment, there are three data latches per sense module. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Figure 2A:
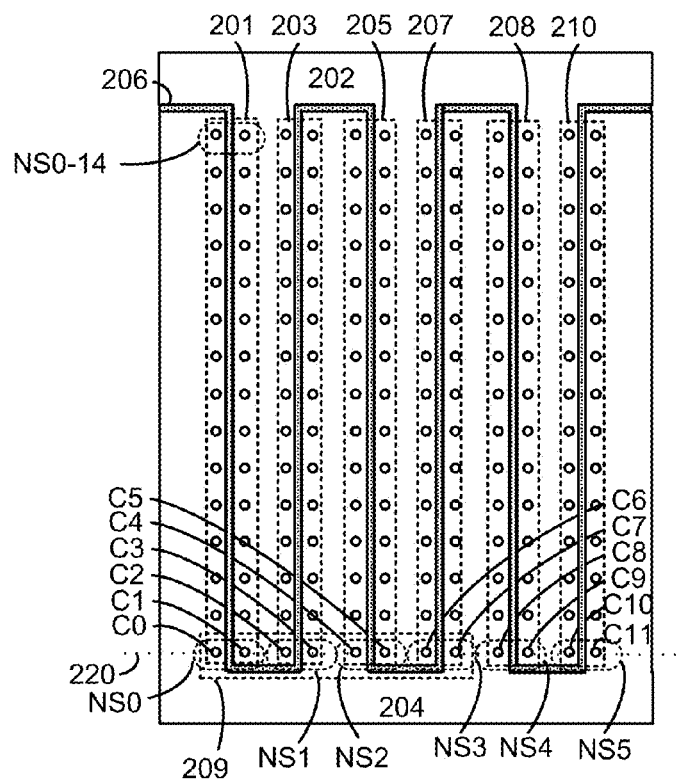
FIG. 2A depicts a top view of example word line layers 202 and 204 in a U-shaped NAND embodiment, as an example implementation of BLK0 in FIG. 1A.

FIG. 2A depicts a top view of example word line layers 202 and 204 in a U-shaped NAND embodiment, as an example implementation of BLK0 in FIG. 1A. In a 3D stacked memory device, memory cells are formed along memory holes which extend through alternating conductive and dielectric layers in a stack. The memory cells are typically arranged in NAND strings. Each conductive layer can include one or more word line layers. A word line layer is an example of a word line.

The view is of a representative layer among the multiple WLLs in a stack. Referring also to FIG. 2C, the stack includes alternating dielectric and conductive layers. The dielectric layers include DL0 to DL25 and may be made of $SiO_2$, for instance. The conductive layers include a back gate layer (BGL), data-storing word line layers WLL0 to WLL19, dummy (non-data-storing) word line layers DWLLa and DWLLb, and select gate layers SGL1, SGL2 and SGL3. The word line layers are conductive paths to control gates of the memory cells at the layer. Moreover, each select gate layer may comprises conductive lines to select gate transistors (e.g., SGD and/or SGS transistors).

The word line layers of FIG. 2A may represent any one of the word line layers in FIG. 2C. These conductive layers may include doped polysilicon, metal such as tungsten or metal silicide, for instance. An example voltage of 5-10 V may be applied to the back gate to maintain a conductive state which connects the drain- and source-side columns.

For each block, each conductive layer may be divided into two word line layers 202 and 204 which are insulated from one another by a slit 206. The slit is formed by etching a void which extends vertically in the stack, typically from an etch stop layer at the bottom to at least a top layer of the stack, then filling the slit with insulation. This is an example of the type of etching which can result in the accumulation of charges in the top conductive layer of the stack. The slit 206 is a single continuous slit which extends in a zig-zag pattern in the block. This approach can provide greater flexibility in controlling the memory cells since the WLLs can be driven independently.

Each block includes vertically-extending memory holes or pillars which extend vertically in the stack, and comprise a column of memory cells such as in a NAND string. Each circle represents a memory hole or a memory cell associated with the word line layer. Example columns of memory cells along a line 220 include C0 to C11. Columns C0, C3, C4, C7, C8 and C11 represent the drain side columns of respective NAND strings. Columns C1, C2, C5, C6, C9 and C10 represent the source side columns of respective NAND strings. The figure represents a simplification, as many more rows of memory holes will typically be used, extending to the right and left in the figure. Also, the figures are not necessarily to scale. The columns of memory cells can be arranged in subsets such as sub-blocks.

Further, the NAND strings are arranged in sets, where each NAND string in a set has an SGD transistor with a common control gate voltage. See also FIG. 2B. Regions 201, 203, 205, 207, 208 and 210 each represent a set of NAND strings, or a set of memory cells in a word line layer. For example, region 210 includes NAND strings NS0, . . . , NS0-14. A programming operation can involve one set of NAND strings. Each NAND string in a set can be associated with a respective bit line which is independently controlled to allow or inhibit programming.

The drawings are not to scale and do not show all memory columns. For example, a more realistic block might have twelve memory columns in the y direction as shown, but a very large number such as 32 k memory columns in the x direction, for a total of 384,000 memory columns in a block. With U-shaped NAND strings, 192 k NAND strings are provided in this example. With straight NAND strings, 384,000 NAND strings are provided in this example. Assuming there are twenty-four memory cells per column, there are 384,000×24=9,216,000 memory cells in the set.

Figure 2B:
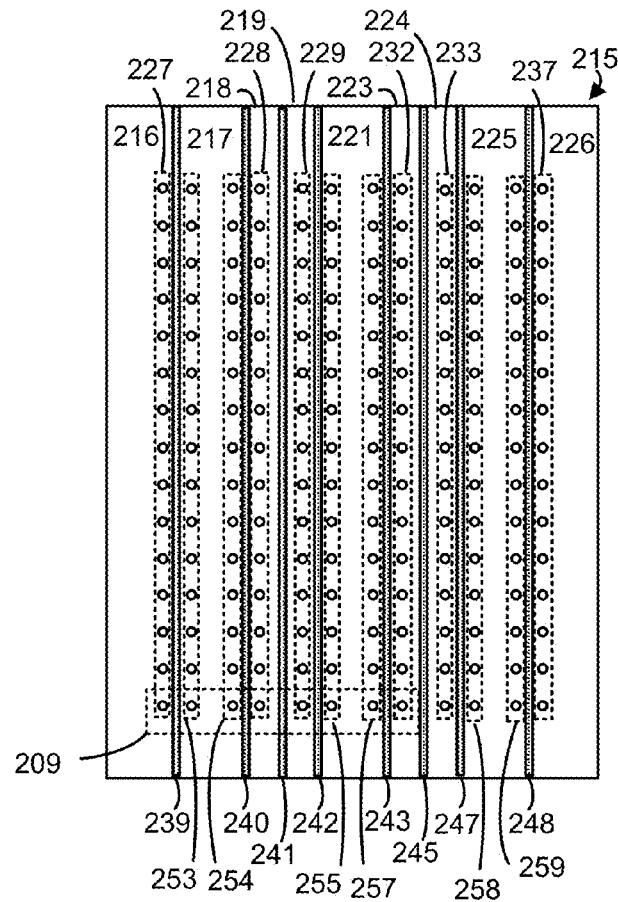
FIG. 2B depicts a top view of example select gate layer portions, consistent with FIG. 2A.
Figure 2C:
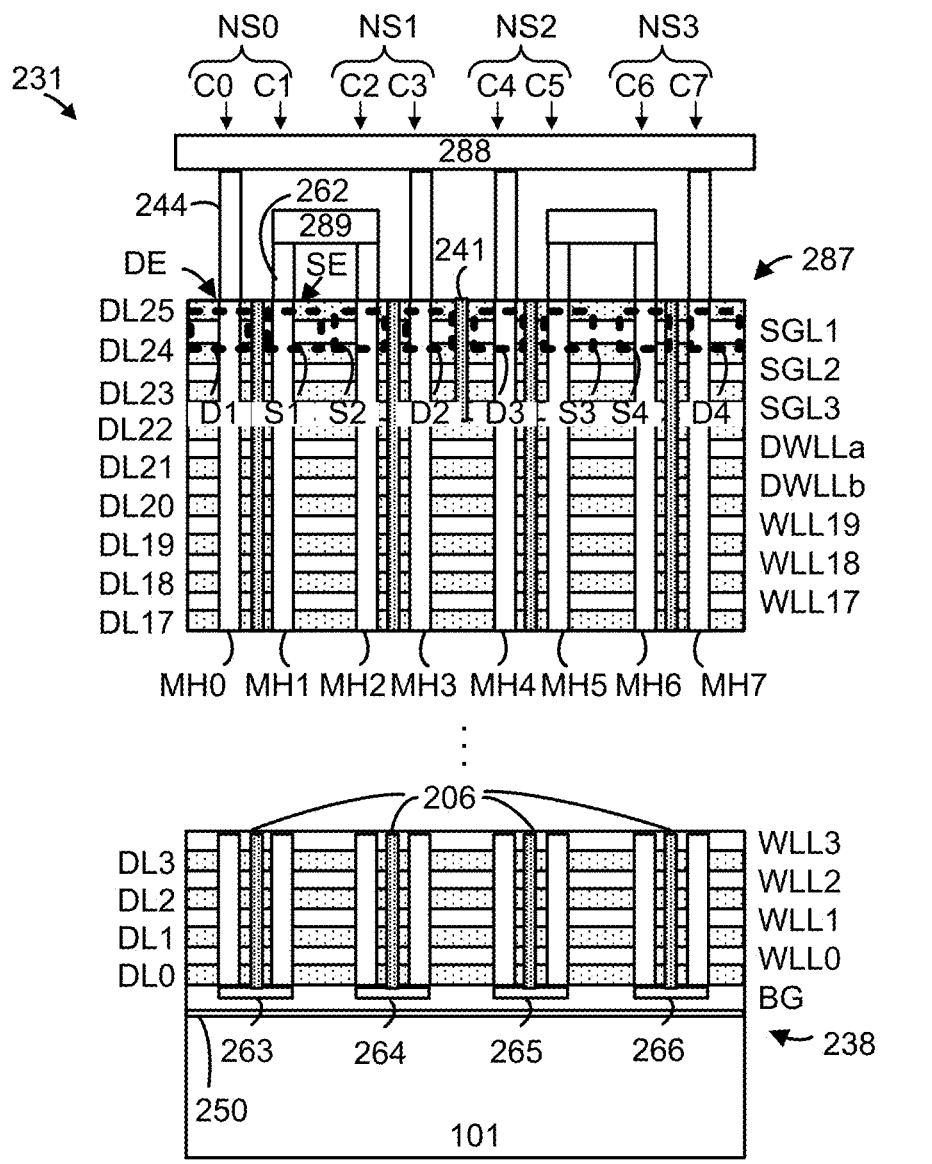
FIG. 2C depicts an embodiment of a stack 231 showing a cross-sectional view of the portion 209 of FIG. 2A, along line 220, where three select gate layers, SGL1, SGL2 and SGL3 are provided.

FIG. 2B depicts a top view of example select gate layer portions, consistent with FIG. 2A. In one approach, the select gate layer 215 is different than a WLL in that a separate SGD layer portion or line, is provided for each set of NAND strings. That is, each single row of SGD transistors extending in the x direction is separately controlled. In other words, the control gates of the SGD transistors in each set of NAND strings are commonly controlled.

Further, an SGS layer portion or line is provided for a pair of rows of SGS transistors extending in the x direction, in one approach, for adjacent sets of NAND strings. Optionally, additional slits are used so that a separate SGS layer portion is provided for a single row of SGS transistors extending in the x direction. Thus, the control gates of the SGS transistors in a pair of rows of SGS transistors, or in a single row of SGS transistors, are also commonly controlled.

The SGS and SGD layer portions are created due to slits 239, 240, 241, 242, 243, 245, 247 and 248. The slits extend partway down in the stack as depicted by example slit 241 in FIG. 2C. Regions 227, 228, 229, 232, 233 and 237 represent SGD transistors in SGD lines 216, 218, 219, 223, 224 and 226, respectively. Regions 253 and 254, 255 and 257, and 258 and 259 represent SGS transistors in SGS lines 217, 221 and 225, respectively. Regions 255 and 257, 258 and 259, represent SGS transistors in SGS layer portions 221 and 225, respectively. The portion 209 from FIG. 2A is repeated for reference.

The select gate transistors are associated with NAND strings NS0-NS5.

FIG. 2C depicts an embodiment of a stack 231 showing a cross-sectional view of the portion 209 of FIG. 2A, along line 220, where three select gate layers, SGL1, SGL2 and SGL3 are provided. In this case, the slit extends down to DL22, so that three separate layers of select gate transistors are formed in each column of each NAND string. The stack has a top 287 and a bottom 238.

The conductive layers of the select gates can have a same height (channel length) as the conductive layers of the memory cells, in one approach. This facilitates the fabrication of the memory device. In a column, the individual select gate transistors together are equivalent to one select gate transistor having a channel length which is the sum of the channel lengths of the individual select gate transistors. Further, in one approach, select gate transistors in a column (e.g., in layers SGL1, SGL2 and SGL3) are connected and received a common voltage during operations. The SGS transistors can have a similar construction as the SGD transistors. Further, the SGS and SGD transistors can have a similar construction as the memory cell transistors.

The substrate may be p-type and can provide a ground which is connected to the top select gate layer, in one approach. A via 244 connects a drain side of C0 and NS0 to a bit line 288. A via 262 connects a source side of C1 and NS0 to a source line 289. Back gates 263, 264, 265 and 266 are provided in NS0, NS1, NS2 and NS3, respectively.

Regions D1, D2, D3 and D4 represent SGD transistors and regions S1, S2, S3 and S4 represent SGS transistors in SGL1.

Figure 2D:
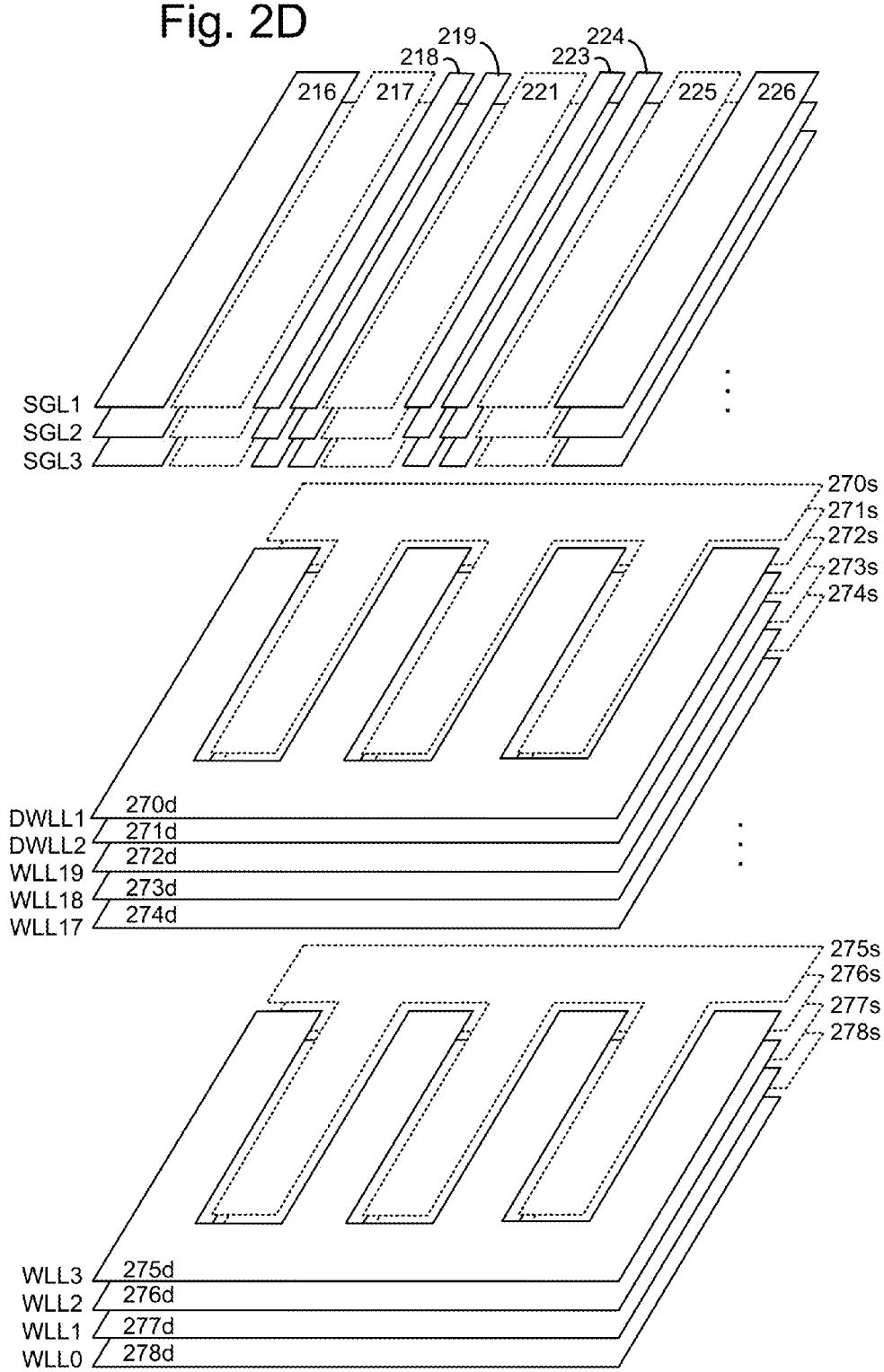
FIG. 2D depicts an alternative view of the select gate layers and word line layers of the stack 231 of FIG. 2C.

FIG. 2D depicts an alternative view of the select gate layers and word line layers of the stack 231 of FIG. 2C. The SGL layers SGL1, SGL2 and SGL3 each includes parallel rows of select gate lines associated with the drain-side (shown by solid lines) or source-side (shown by dotted lines) of a set of NAND strings. For example, SGL1 includes drain-side select gate lines 216, 218, 219, 223, 224 and 226 and source-side select gate lines 217, 221 and 225, consistent with FIG. 2B. Each select gate line can be independently controlled, in one approach.

Below, the SGL layers are the word line layers. Each word line layer includes a drain-side word line connected to memory cells on a drain-side of a NAND string (the half of a NAND string between the back gate and the drain end) and a source-side word line connected to memory cells on a source-side of a NAND string (the half of a NAND string between the back gate and the source end). For example, DWLL1, DWLL2, WLL19, WLL18 and WLL17 include drain-side word lines 270$d$, 271$d$, 272$d$, 273$d$ and 274$d$, respectively, and source-side word lines 270$s$, 271$s$, 272$s$, 273$s$ and 274$s$, respectively.

WLL3, WLL2, WLL1 and WLL0 include drain-side word lines 275d, 276d, 277d and 278d, respectively, and source-side word lines 275s, 276s, 277s and 278s, respectively. Each word line can be controlled independently, in one approach.

In an example programming operation, the source-side word line 272s is a first programmed word line and a drain-side word line 272d is a final programmed word line in a block.

FIG. 3A depicts a top view of an example word line layer 304 of the block BLK0 of FIG. 1A, in a straight NAND string embodiment. In this configuration, a NAND string has only one column, and the source-side select gate is on the bottom of the column instead of on the top, as in a U-shaped NAND string. Moreover, a given level of a block has one WLL which is connected to each of the memory cells of the layer. Insulation-filled slits 346, 347, 348, 349 and 350 can also be used in the fabrication process to provide structural support for the stack when undoped polysilicon layers are removed by a wet etch and a dielectric is deposited to form the alternating dielectric layers. A dashed line 305 extends through columns C12-C17. A cross-sectional view along line 305 of portion 307 is shown in FIG. 3C1.

Regions 340, 341, 342, 343, 344 and 345 represent the memory cells (as circles) of respective sets of NAND strings. For example, region 340 represents memory cells in NAND strings NS0A, NS0A-14. Additional NAND strings include NS1A, NS2A, NS3A, NS4A and NS5A.

Alternatively, the layer 304 represents an SGS layer, in which case each circle represents an SGS transistor.

FIG. 3B depicts a top view of an example SGD layer 362, consistent with FIG. 3A. Slits 357, 358, 359, 360 and 361 divide the SGD layer into portions 363, 364, 365, 366, 367 and 368. Each portion connects the SGD transistors in a set of NAND strings. For example, SGD layer portion 363 or line connects the SGD transistors in the set of NAND strings NS0A to NS0A-14. Regions 351, 352, 353, 354, 355 and 356 represent the SGD transistors (as circles) of respective sets of NAND strings in the SGD layer portions 363, 364, 365, 366, 367 and 368, respectively. The portion 307 from FIG. 3A is also repeated. The select gate transistors are associated with NAND strings NS0A-NS5A.

FIG. 3C1 depicts an embodiment of a stack 376 showing a cross-sectional view of the portion 307 of FIG. 3A, along line 305, where three SGD layers, three SGS layers and dummy word line layers DWLL1 and DWLL2 are provided. Columns of memory cells corresponding to NAND strings NS0A-NS3A are depicted in the multi-layer stack. The stack includes a substrate 101, an insulating film 250 on the substrate, and a portion of a source line SL0A. Additional straight NAND strings in a SGD line subset extend behind the NAND strings depicted in the cross-section, e.g., along the x-axis. NS0A has a source end SEa and a drain end DEa. The slits 346, 347 and 348 from FIG. 3A are also depicted. A portion of the bit line BL0A is also depicted. A conductive via 373 connects DEa to BL0A. The columns are formed in memory holes MH0-MH4. The memory holes are columnar and extend at least from a top 370 to a bottom 371 of the stack.

The source line SL0A is connected to the source ends of each NAND string. SL0A is also connected to other sets of memory strings which are behind these NAND strings in the x direction.

Word line layers, e.g., WLL0-WLL23, and dielectric layers, e.g., DL0-DL24, are arranged alternatingly in the stack. SGS transistors 369, 372, 374 and 375 are formed in the SGS1 layer.

Figure 4C:
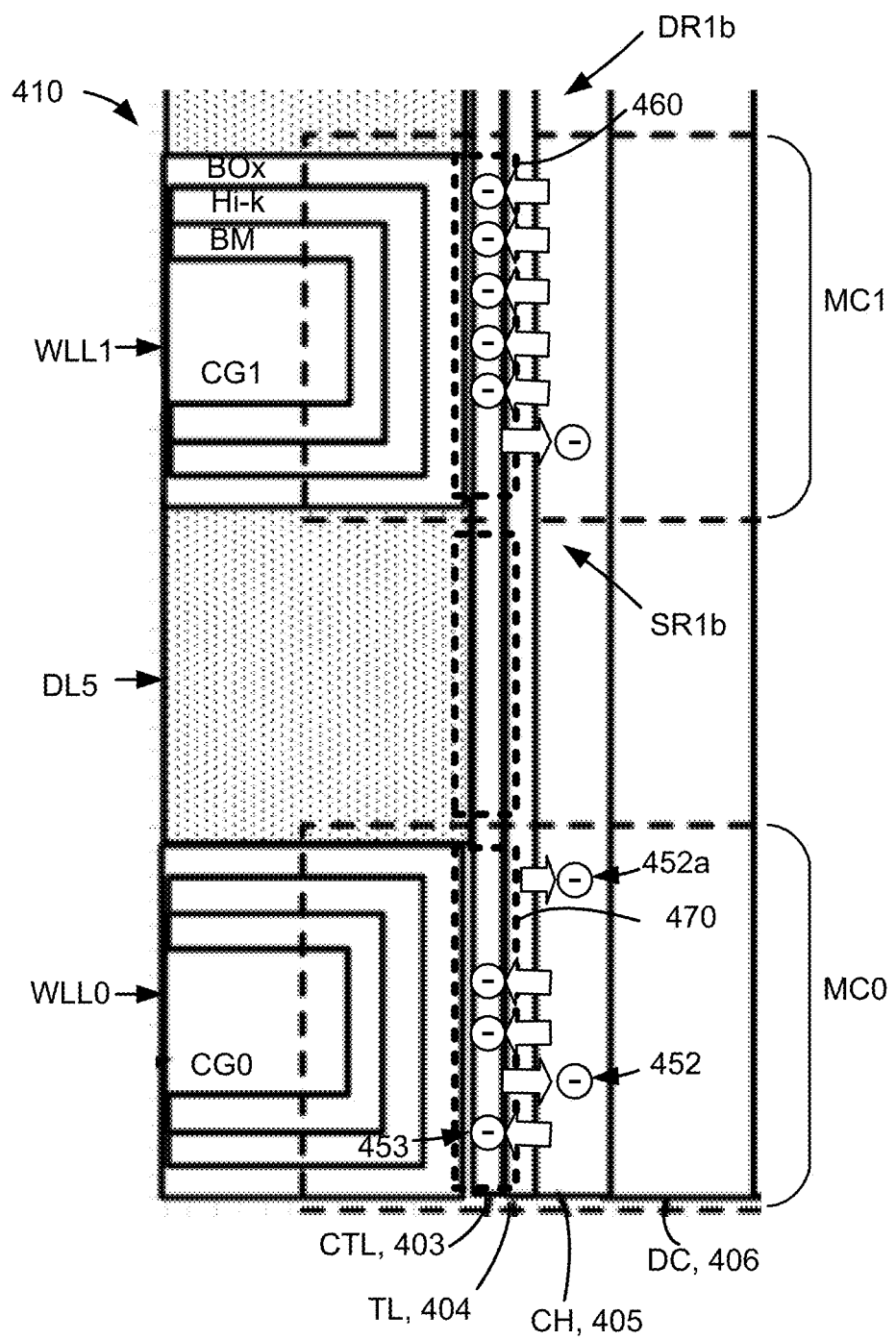
FIG. 4C depicts an expanded view of a region 410 of the NAND string of FIG. 3C2.

A region 246 of the stack is shown in greater detail in FIG. 4A. A region 410 of the stack is shown in greater detail in FIG. 4C. Regions D1a, D2a, D3a and D4a represent SGD transistors.

FIG. 3C2 depicts a variation in the width of a memory hole along its height. Due to the etching process used to create the memory holes, the cross-sectional width, e.g., diameter, of the memory hole can vary along its height. This is due to the very high aspect ratio. For example, a depth-to-diameter ratio of about 25-30 is common. Typically, the diameter becomes progressively smaller from the top to the bottom of the memory hole. In some case, a slight narrowing occurs at the top of the hole, as depicted, so that the diameter becomes slight wider before becoming progressively smaller from the top to the bottom of the memory hole.

Due to the non-uniformity in the width of the memory hole, and the width of the vertical pillar which is formed in the memory hole, the programming and erase speed of the memory cells can vary based on their position along the memory hole. With a smaller diameter memory hole, the electric field across the tunneling layer is stronger, so that the programming and erase speed is higher.

In this case, the memory cells are arranged along vertically-extending memory holes (MH0-MH7) in the memory device, and a width of the vertically-extending memory holes varies along a height of the memory device.

Figure 3D:
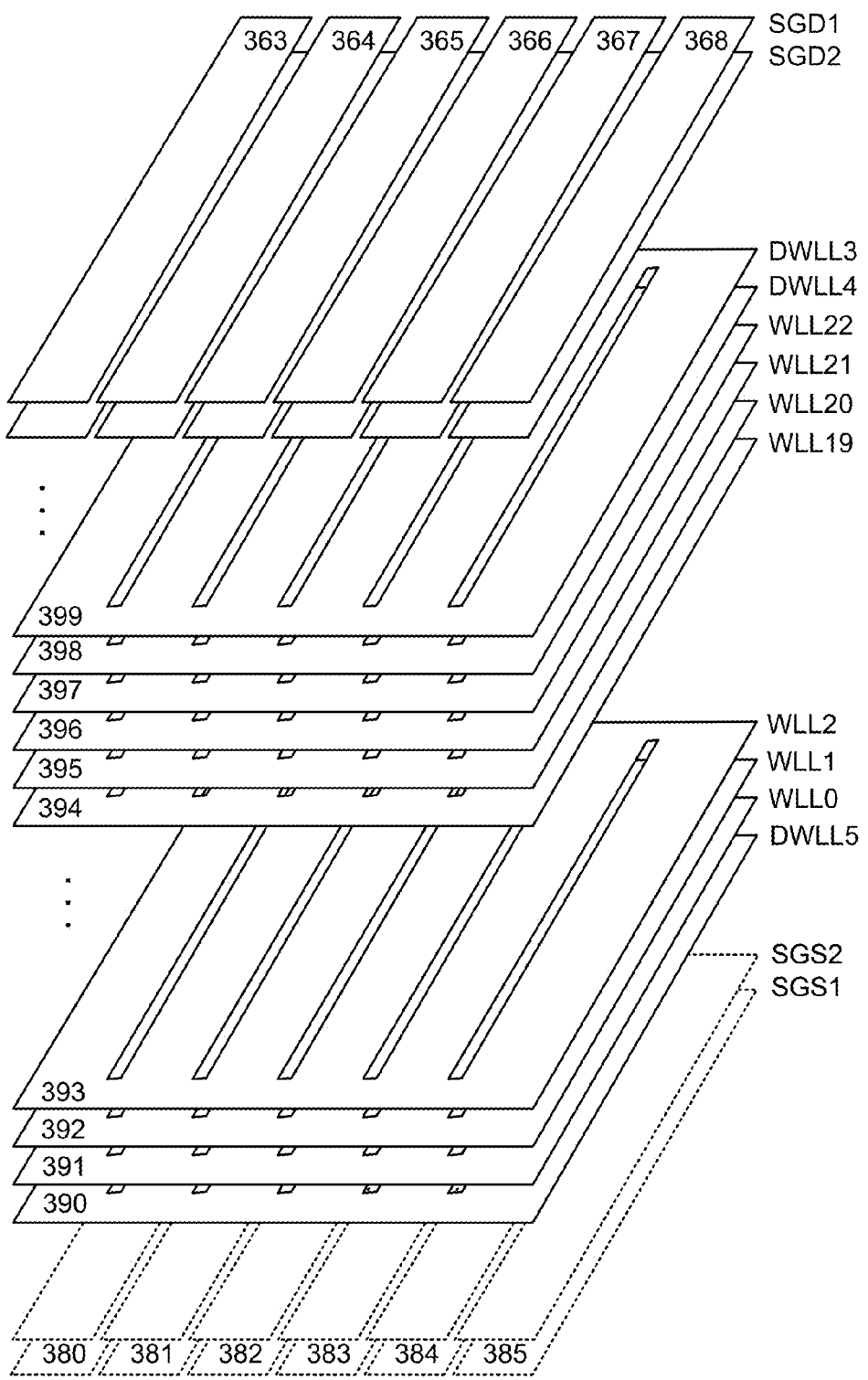
FIG. 3D depicts an alternative view of the select gate layers and word line layers of the stack 376 of FIG. 3C.

FIG. 3D depicts an alternative view of the select gate layers and word line layers of the stack 376 of FIG. 3C. The SGD layers SGD1 and SGD2 each includes parallel rows of select gate lines associated with the drain-side of a set of NAND strings. For example, SGD1 includes drain-side select gate lines 363, 364, 365, 366, 367 and 368, consistent with FIG. 3B. Each select gate line can be independently controlled, in one approach.

Below the SGD layers are the word line layers. Each word line layer represents a word line, in one approach, and is connected to a set of memory cells at a given height in the stack. For example, DWLL3, DWLL4, WLL22, WLL21, WLL20 and WLL19 represent word lines 399, 398, 397, 396, 395 and 394, respectively. WLL2, WLL1, WLL0 and DWLL5 represent word lines 393, 392, 391 and 390, respectively. Each word line can be controlled independently, in one approach.

Below the word line layers are the SGS layers. The SGS layers SGS1 and SGS2 each includes parallel rows of select gate lines associated with the source-side of a set of NAND strings. For example, SGS1 includes source-side select gate lines 380, 381, 382, 383, 384 and 385. Each select gate line can be independently controlled, in one approach.

In an example programming operation, the source-side word line 391 is a first programmed word line and a drain-side word line 397 is a final programmed word line in a block.

FIG. 4A depicts a view of the region 246 of FIG. 3C1, showing SGD transistors D1a, D1a1 and D1a2 above a dummy memory cell (DMC) and a data-storing memory cell (MC). A number of layers can be deposited along the sidewalls of the column and within each word line layer. These layers can include oxide-nitride-oxide (O—N—O) and polysilicon layers which are deposited, e.g., using atomic layer deposition. For example, the column includes a charge-trapping layer or film (CTL) 403 such as SiN or other nitride, a tunneling layer (TL) 404, a polysilicon body or channel (CH) 405, and a dielectric core (DC) 406. A word line layer includes a block oxide (BOx) 402, a block high-k material 401, a barrier metal 400, and a conductive metal such as W 399 as a control gate. For example, control gates CG1a, CG1a1, CG1a2, CG1a3 and CG1a4 are provided for the SGD transistors D1a, D1a1 and D1a2, the dummy memory cell DMC and the memory cell MC, respectively. In another approach, all of these layers except the metal are provided in the column. Additional memory cells are similarly formed throughout the columns. The layers in the memory hole form a columnar active area (AA) of the NAND string.

The use of one or more dummy memory cells between the select gate transistors and the data-storing memory cells is useful since program disturb can be greater for memory cells adjacent to, or close to, the select gate transistors. These edge cells have a lower amount of channel boosting due to constraints on the voltages of the select gate transistors of an inhibited NAND string. In particular, to provide the select gate transistors in a non-conductive state, a relatively low voltage is applied to their control gates, resulting in a relatively low amount of channel boosting in a region of the channel next to these select gate transistors. A region of the channel next to an edge cell will therefore also have a relatively low amount of channel boosting. In contrast, the memory cells next to a non-edge cell can receive a relatively high pass voltage since these cells are provided in a conductive state, resulting in a relatively higher amount of channel boosting.

When a memory cell is programmed, electrons are stored in a portion of the CTL which is associated with the memory cell. These electrons are drawn into the CTL from the channel, and through the tunneling layer (TL). The Vth of a memory cell is increased in proportion to the amount of stored charge. During an erase operation, the electrons return to the channel.

Each of the memory holes can be filled with a plurality of annular layers comprising a block oxide layer, a charge trapping layer, a tunneling layer and a channel layer. A core region of each of the memory holes is filled with a body material, and the plurality of annular layers are between the core region and the WLLs in each of the memory holes.

FIG. 4B1 depicts a cross-section view of the region 246 of FIG. 4A along line 444. Each layer is ring-shaped in one possible approach, except the core filler, which is a cylinder.

FIG. 4B2 depicts a close-up view of the tunneling layer 404 of FIG. 4B1, showing an oxide 404a, nitride 404b, oxide 404c configuration.

FIG. 4C depicts an expanded view of a region 410 of the NAND string of FIG. 3C2. When a program voltage is applied to the control gate of a memory cell via a respective word line, an electric field is generated. In MC0, the electric field causes electrons to tunnel into a region 470 of the charge-trapping layer 403, from the channel 405. Similarly, for MC1, the electric field causes electrons to tunnel into a region 460 of the charge-trapping layer 403, from the channel 405. The movement of the electrons into the charge-trapping layer is represented by the arrows which point to the left. The electrons are represented by circles with a dash inside the circle.

When a memory cell on a selected word line is subsequently read back, control gate read voltages such as VrE/A, VrA/B and VrB/C are applied to the memory cell while sensing circuitry determines whether the memory cell is in a conductive state. At the same time, a read pass voltage, Vread (e.g., 8-9 V), is applied to the remaining word lines.

However, as mentioned at the outset, the accuracy of the read back operation can be impaired by charge loss in the memory cells. One type of charge loss involves de-trapping from the charge-trapping layer. For example, an electron 452 is an example of a charge which has de-trapped from the charge-trapping region 470, lowering the Vth of MC0. An electron 453 is an example of a charge which remains in the charge-trapping region 470. Another type of charge loss involves de-trapping from the tunneling layer. For example, an electron 452a is an example of a charge which has de-trapped from the tunneling layer 404.

MC1 has a drain DR1b, a source SR1b and a control gate CG1.

Figure 5A:
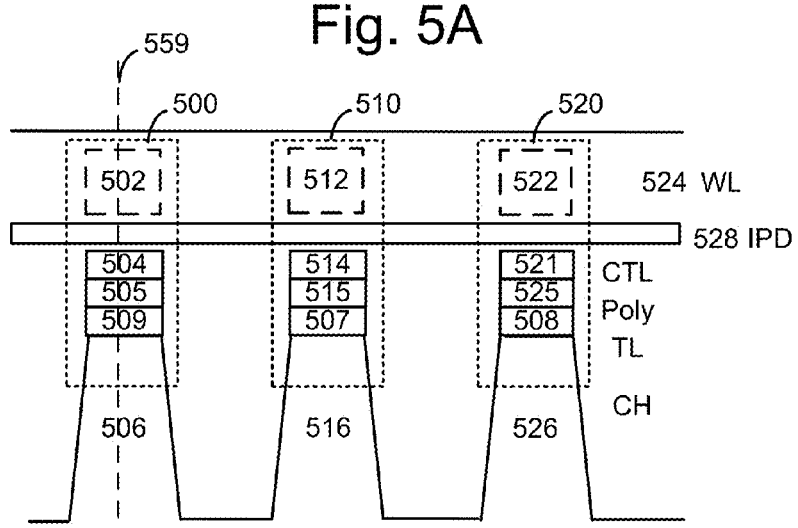
FIG. 5A depicts a cross-sectional view in a word line direction of memory cells comprising a flat control gate and charge-trapping regions as a 2D example of memory cells in the memory structure 126 of FIG. 1B.

FIG. 5A depicts a cross-sectional view in a word line direction of memory cells comprising a flat control gate and charge-trapping regions a 2D example of memory cells in the memory structure 126 of FIG. 1B. Charge-trapping memory can be used in NOR and NAND flash memory device. This technology uses an insulator such as an SiN film to store electrons, in contrast to a floating-gate MOSFET technology which uses a conductor such as doped polycrystalline silicon to store electrons. As an example, a word line (WL) 524 extends across NAND strings which include respective channel regions 506, 516 and 526. Portions of the word line provide control gates 502, 512 and 522. Below the word line is an inter-poly dielectric (IPD) layer 528, charge-trapping layers 504, 514 and 521, polysilicon layers 505, 515 and 525 and tunnel ling layer (TL) layers 509, 507 and 508. Each charge-trapping layer extends continuously in a respective NAND string.

A memory cell 500 includes the control gate 502, the charge-trapping layer 504, the polysilicon layer 505 and a portion of the channel region 506. A memory cell 510 includes the control gate 512, the charge-trapping layer 514, a polysilicon layer 515 and a portion of the channel region 516. A memory cell 520 includes the control gate 522, the charge-trapping layer 521, the polysilicon layer 525 and a portion of the channel region 526.

Further, a flat control gate may be used instead of a control gate that wraps around a floating gate. One advantage is that the charge-trapping layer can be made thinner than a floating gate. Additionally, the memory cells can be placed closer together.

Figure 5B:
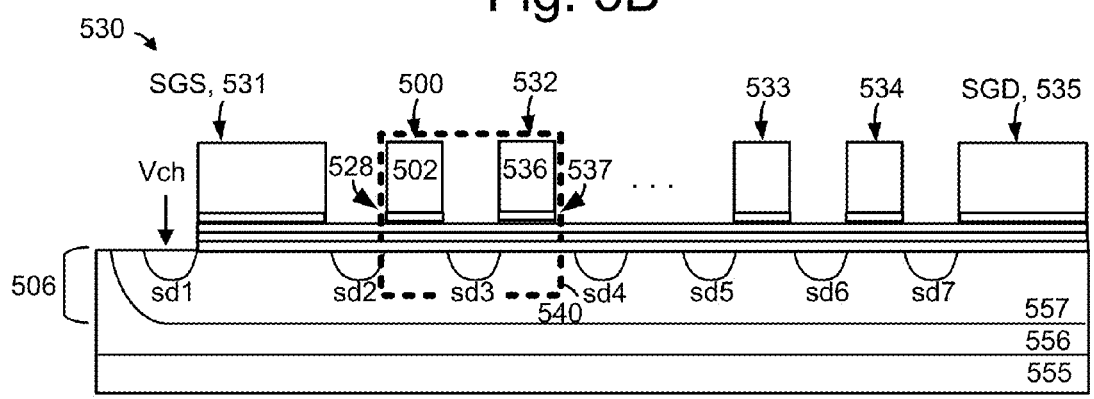
FIG. 5B depicts a cross sectional view along line 559 in FIG. 5A, showing a NAND string 530 having a flat control gate and a charge-trapping layer.

FIG. 5B depicts a cross sectional view along line 559 in FIG. 5A, showing a NAND string 530 having a flat control gate and a charge-trapping layer. The NAND string 530 includes an SGS transistor 531, example storage elements 500, 532, . . . , 533 and 534, and an SGD transistor 535. In one option, the SGD transistor can be biased to produce GIDL during an erase operation, as discussed primarily in connection with the 3D memory device. In another option, the substrate can be biased directly to provide a channel voltage, while the word lines are biased at a negative voltage.

The NAND string may be formed on a substrate which comprises a p-type substrate region 555, an n-type well 556 and a p-type well 557. N-type source/drain diffusion regions sd1, sd2, sd3, sd4, sd5, sd6 and sd7 are formed in the p-type well 557. A channel voltage, Vch, may be applied directly to the channel region of the substrate. The memory cell 500 includes the control gate 502 and an IPD portion 528 above the charge-trapping layer 504, the polysilicon layer 505, the tunneling layer 509 and the channel region 506. The memory cell 532 includes a control gate 536 and an IPD portion 537 above the charge-trapping layer 504, the polysilicon layer 505, the tunneling layer 509 and the channel region 506.

The control gate layer may be polysilicon and the tunneling layer may be silicon oxide, for instance. The IPD layer can be a stack of high-k dielectrics such as AlOx or HfOx which help increase the coupling ratio between the control gate layer and the charge-trapping or charge storing layer. The charge-trapping layer can be a mix of silicon nitride and oxide, for instance. A difference between a floating gate memory cell and the flat memory cell is the height of the charge storage layer. A typically floating gate height may be about 100 nm, while a charge-trapping layer can be as small as 3 nm, and the polysilicon layer can be about 5 nm.

The SGD and SGS transistors have the same configuration as the storage elements but with a longer channel length to ensure that current is cutoff in an inhibited NAND string.

In this example, the layers 504, 505 and 509 extend continuously in the NAND string. In another approach, portions of the layers 504, 505 and 509 which are between the control gates 502, 512 and 522 can be removed, exposing a top surface of the channel 506.

Figure 5C:
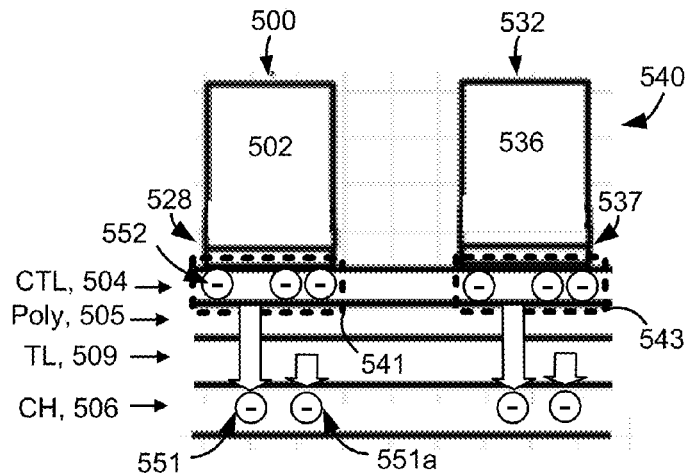
FIG. 5C depicts an expanded view of a portion 540 of the NAND string of FIG. 5B.

FIG. 5C depicts an expanded view of a portion 540 of the NAND string of FIG. 5B. The charge-trapping layer 504 includes regions 541 and 543 which are directly under and adjacent to the memory cells 500 and 532, respectively. Charge loss can occur in a 2D memory device in a similar way as in the 3D memory device. An electron 551 is an example of a charge which has de-trapped from the charge-trapping region 541, lowering the Vth of the memory cell 500. An electron 552 is an example of a charge which remains in the charge-trapping region 541. An electron 551a is an example of a charge which has de-trapped from the tunneling layer 509.

Figure 6A:
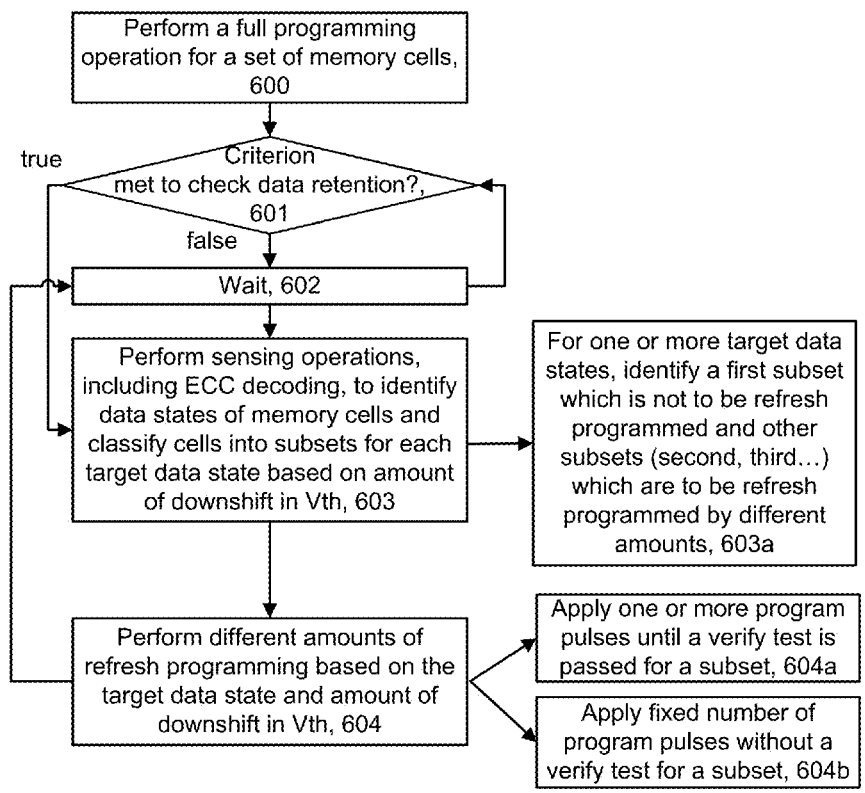
FIGS. 6A and 6B depict a one-pass full programming operation with four data states as an example of the programming pass of FIG. 5C.

FIG. 6A depicts a process for operating a memory device in which a full programming operation is followed by a refresh programming operation. Step 600 includes performing a full programming operation for a set of memory cells to store write data into the set of memory cells. The memory cells can be programmed from the erased state to different target data states in one or more program passes. For example, a program pass can involve applying a series of program pulses to the set of memory cells, starting from an initial program pulse, and incrementing the program pulse in each loop of a plurality of program loops. Typically, verify tests are performed in each program loop. A verify test is passed when the Vth of a memory cell exceeds a control gate voltage on a word line which is connected to the set of memory cells. A full programming operation is completed when all, or almost all of the memory cells which are to be programmed to a target data state, have passed a respective verify test. For example, see FIGS. 7A, 7B, 8A and 8B.

After completion of the full programming operation, decision step 601 determines if a criterion is met to check the data retention of the set of memory cells. For example, the criterion can include passage of a specified amount of time, e.g., a number of days, weeks or months. In one approach, described by the dotted-line squares in the timeline of FIG. 13A, the data retention check occurs at uniform time intervals after completion of the full programming operation. The data retention check occurs for all target data states, for example.

When the set of memory cells is subsequently erased and used to store new data, in another full programming, the timeline is reset to zero. In another approach, described by the solid-line squares in the timeline of FIG. 13A, the data retention check occurs at progressively shorter time intervals after completion of the full programming operation. This is based on a theory that charge loss occurs at a faster rate in proportion to the time since the completion of the full programming operation, so that a check of the data retention should occur progressively more frequently as time progresses. This avoids an excessive charge loss which can lead to uncorrectable read errors.

In another approach, described by the timeline of FIG. 13B, the data retention check occurs each time a temperature in the memory device exceeds a threshold temperature for a specified cumulative amount of time. This is based on the theory that charge loss occurs primarily when the temperature is above a threshold temperature, so that the time for the data retention check should be based on a measure of when the temperature is above a threshold temperature.

In another approach, described by the timelines 1310, 1312 and 1314 of FIG. 13C, the data retention check occurs at different times and frequencies for different data states. For example, the data retention check occurs four times in the timeline 1310 for the C state, two times in the timeline 1312 for the B state, and once for in the timeline 1314 for the A state. The same time period id covered by these three timelines. The data retention checks for the A and B states are optionally aligned with the data retention checks for the C state. This is based on the theory that charge loss is higher for higher data states, so that the time for the data retention check of a higher data state should be sooner than the time for the data retention check of a lower data state.

If decision step 601 is false, a wait step 602 is reached, after which decision step 601 can be evaluated again. If decision step 601 is true, step 603 is reached. This step involves performing sensing operations to identify data states of the memory cells in the set, and to classify the memory cells into subsets for each target data state based on amount of downshift in Vth. The sensing operations can include ECC decoding. For example, see FIGS. 7C and 8C. Step 603a includes, for one or more target data states, identifying a first subset of memory cells which is not to be refresh programmed and other subsets (e.g., second, third . . . ) which are to be refresh programmed by different amounts. Step 604 includes performing different amounts of refresh programming for the subsets based on the target data state and the amount of downshift in Vth. For example, see FIG. 7D. The refresh programming for a subset can involve applying one or more program pulses until a verify test is passed for the subset (step 604a). This is an adaptive approach which ensures that the Vth of the memory cells of the subset have exceeded a verify voltage. Or, the refresh programming for a subset can involve applying a fixed number of one or more program pulses without a verify test for the subset (step 604b). This is a non-adaptive approach in which the number, magnitude and/or duration of the program pulses is set to provide a desired upshift in Vth. This approach can save time since verify operations are avoided. Step 604a or 604b can be selected for each subset individually.

Many variations are possible. For example, it is possible to refresh program all subsets of one target data state using step 604a, and refresh program all subsets of another target data state using step 604a. It is also possible to refresh program one or more subsets of one target data state using step 604a, and to refresh program one or more other subsets of the one target data state using step 604b. Further, program pulses used in step 604a can be separate from, or the same as, program pulses used in step 604b, when refresh programming subsets of a target data state.

Figure 6B:
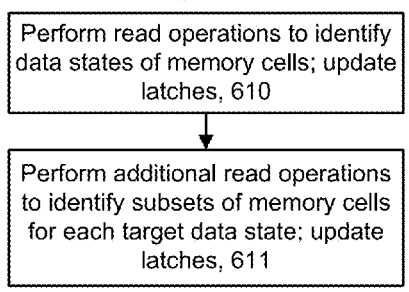

FIG. 6B depicts a process for performing sensing operations consistent with step 603 of FIG. 6A. Step 610 includes performing read operations to identify the data states of the memory cells in the set, and updating latches associated with the memory cells based on the read results. For example, see FIGS. 7C, 8C and 10B. In FIG. 7B, the data states Er, A, B and C can be identified by reading the memory cells using control gate voltages of VrEr/A, VrA/B and VrB/C. For example, a memory cell with Vth<VrEr/A is in the E state, a memory cell with VrEr/A<Vth<VrA/B is in the A state, a memory cell with VrA/B<Vth<VrB/C is in the B state, and a memory cell with Vth>VrB/C is in the C state. In some cases, a subset of memory cells which are corrected using ECC decoding is identified. A memory cell for which one or more bits are corrected, e.g., flipped, due to ECC decoding, is a corrected memory cell.

ECC decoding can determine that a memory cell is supposed to be in a certain data state even when the memory cell is read as being in another data state. For example, a memory cell for which Vth<VrB/C, indicating a B state memory cell, may be corrected to represent the C state. An ECC code can have redundancies which allow a limited number of errors to be detected and corrected. Examples of ECC techniques include Low-Density Parity Check (LDPC) codes, Turbo codes and concatenated codes. LDPC codes are highly efficient linear block codes made from many single parity check (SPC) codes. Turbo codes use iterative soft-decoding and combine two or more relatively simple convolutional codes and an interleaver to produce a block code. Concatenated codes combine algebraic block codes and convolutional codes.

The state machine or controller can evaluate the memory cells based on the read results, perform the ECC decoding, and update the latches for each memory cell with the ascertained data state.

As another example of step 610, in FIG. 8C, the data states Er, A, B, C, D, E, F and G can be identified by reading the memory cells using control gate voltages of VrEr/A, VrA/B, VrB/C, VrC/D, VrD/E, VrE/F and VrF/G.

Step 611 includes performing additional read operations to identify subsets of memory cells for each target data state. For example, in FIG. 7C, the additional read operations use the control gate voltages VrA1, VrB1, VrB2, VrC1, VrC2 and VrC3. In FIG. 8C, the additional read operations use the control gate voltages VrCs1, VrDs1, VrEs1, VrEs2, VrFs1, VrFs2, VrGs1 and VrGs2. For some data states, the additional read operations may not be used. For example, in FIG. 8C, additional read operations are not used between the Er and A states and between the A and B states. In some cases, the additional read operations for a target data state can use the verify voltage of the state. For example, the additional read operations for the C state in FIG. 7C can use VvC. A C state cell with Vth>VvC is then classified into a subset which does not require refresh programming and a C state cell with Vth<VvC is classified into a subset which does require refresh programming. In other cases, the highest control gate voltage of the additional read operations for a target data state is below the verify voltage of the state by a margin (e.g., $\Delta$VA, $\Delta$VB or $\Delta$VC in FIG. 14D or 14E). As a result, C state cells, for instance, for which VvC–$\Delta$VC<Vth<VvC are considered to have a minor amount of Vth downshift and are not refresh programmed. These C state cells are in a common subset with the C state cells for which VvC<Vth, where this subset is not refresh programmed.

Figure 6C:
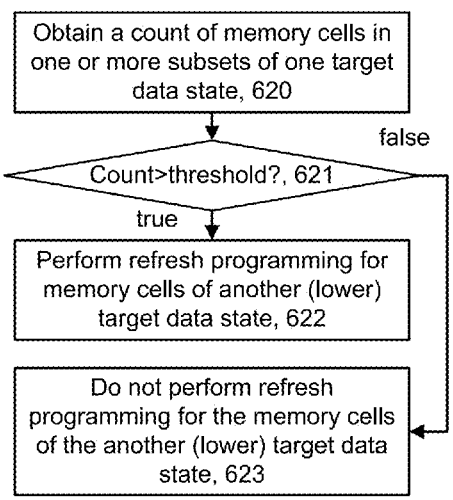
FIG. 6C depicts a process to determine whether to perform refresh programming for memory cells of a target data state based on a measure of Vth downshift for memory cells of a higher target data state.

FIG. 6C depicts a process to determine whether to perform refresh programming for memory cells of a target data state based on a measure of Vth downshift for memory cells of a higher target data state. This is an example of deciding whether to perform refresh programming for memory cells of a lower data state based on an amount of Vth downshift which is seen in cells of a higher data state. In some case, there is more Vth downshift for the memory cells of the higher data states than for the memory cells of the lower data states, such that refresh programming can be skipped for the lower data states. Moreover, a metric of the amount of downshift in the memory cells of a higher data state can be used to predict the amount of downshift in the memory cells of the lower data state. If the predicted amount of downshift in the memory cells of the lower data state is relatively small, a decision can be made to skip the refresh programming for the memory cells of the lower data state. This saves time and power consumption in the memory device.

Moreover, when a plurality of subsets in adjacent Vth ranges are defined for a higher target data state by the read operations in FIG. 6B, a count of memory cells in a lowest subset of the plurality of subsets is most highly predictive of the amount of downshift in the memory cells of the lower data state, since this count represents a magnitude of the lower tail of the Vth distribution of the higher target data state. Optionally, the count of memory cells in another subset (other than the lowest subset) of the plurality of subsets can be predictive of the amount of downshift in the memory cells of the lower data state. Generally, a count of memory cells in one or more subsets of the plurality of subsets can be predictive of the amount of downshift in the memory cells of the lower data state. The count or counts indicate a shape of the lower tail. For example, in a four-state memory device, the higher target data state can be the C state and the lower target data state can be the A state. As another example, in an eight-state memory device, the higher target data state can be the G state and the lower target data state can be the A state.

Also, one or more counts associated with one target data state can be used to decide whether to perform a refresh programming in multiple other target data states which are below the one target data state. A data state is below another data state when a verify voltage of the data state is lower than a verify voltage of the another data state. For example, in a four-state memory device, a count of the C state can be used to decide whether to perform a refresh programming for the A and B states. In another example, in an eight-state memory device, a count of the G state can be used to decide whether to perform a refresh programming for the A and B states.

Also, one or more counts associated with multiple target data states can be used to decide whether to perform a refresh programming in one target data state, or in multiple other target data states, which are below the multiple target data states. For example, in a four-state memory device, a count of the B and C states can be used to decide whether to perform a refresh programming for the A state. In another example, in an eight-state memory device, a count of the F and G states can be used to decide whether to perform a refresh programming for the A state.

In accordance with the above, example, step 620 includes obtaining a count of memory cells in one or more subsets of one target data state. Decision step 621 determines if the count exceeds a threshold. Testing can be performed to provide an optimal threshold which indicates when refresh programming of a specific lower data can be skipped. The threshold can be tailored to the subset and the associated data state. Thus, if the count associated with the one target data state is relatively high, the magnitude of charge loss for the one target data state is relatively high and the magnitude of charge loss for the another target data state is expected to be relatively high, such that the data retention check should involve the another target data state. Or, if the count associated with the one target data state is relatively low, the magnitude of charge loss for the one target data state is relatively low and the magnitude of charge loss for the another target data state is expected to be relatively low, such that the data retention check can skip the another target data state.

This approach assumes the additional read operations are performed for the higher target data state before a decision is made to perform the data retention check for the lower target data state. If decision step 621 is true, step 622 is reached. This step includes performing refresh programming for memory cells of another (lower) target data state. If decision step 621 is false, step 623 is reached. This step includes not performing refresh programming for the memory cells of the another (lower) target data state.

In FIG. 7A-8C, the horizontal axis represents Vth and the vertical axis represents a number of memory cells on a logarithmic scale. The Vth distributions are shown in a simplified form for clarity.

Figure 7A:
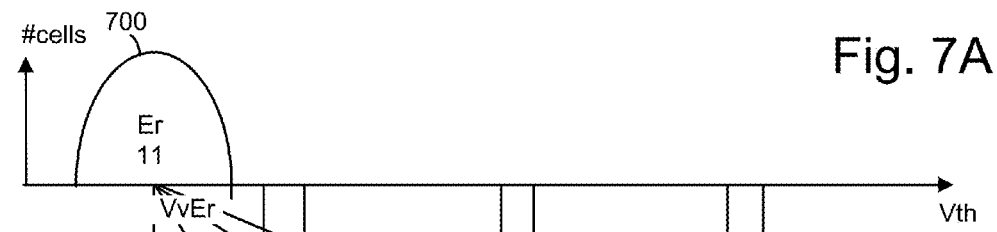
FIGS. 7A and 7B depict a one-pass full programming operation with four data states, consistent with step 600 of FIG. 6A.
Figure 7B:
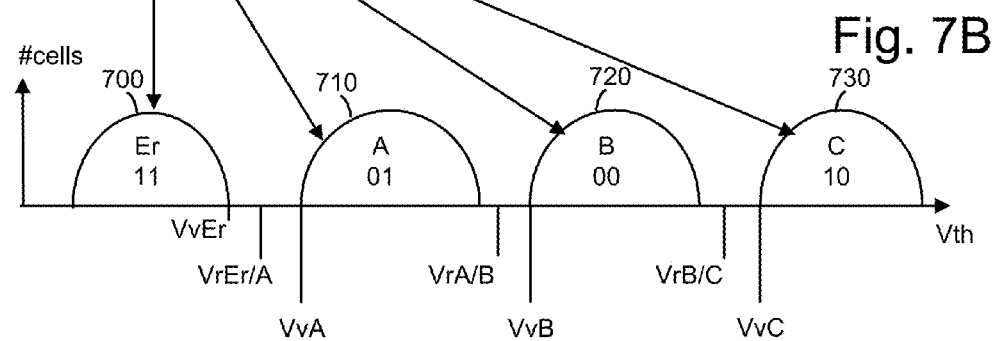

FIGS. 7A and 7B depict a one-pass full programming operation with four data states, consistent with step 600 of FIG. 6A. A one programming pass operation, also referred to as full sequence programming, involves (only) one sequence of multiple program-verify operations (or program loops) which are performed starting from an initial Vpgm level and proceeding to a final Vpgm level until the threshold voltages of a set of selected memory cells reach one or more respective verify voltages of respective target data states. All memory cells may initially be in an erased state at the beginning of the programming pass.

Example Vth distributions for the memory cell array are provided for a case where each memory cell stores two bits of data in one of four possible Vth ranges. One bit represents the LP data and the other bit represents the UP data. A bit combination can be denoted by the UP bit followed by the LP bit, e.g., 11 denotes UP=1 and LP=1, 01 denotes UP=0 and LP=1, 00 denotes UP=0 and LP=0 and 10 denotes UP=1 and LP=0. A bit combination is stored in a set of latches such as in FIG. 1E. For example, the LP bit can be stored in LDL and the UP bit can be stored in UDL.

A first Vth distribution 700 is provided for erased (Er) state memory cells. Three Vth distributions 710, 720 and 730 represent target data states A, B and C, respectively, which are reached by memory cells when their Vth exceeds the verify voltage VvA, VvB or VvC, respectively.

After the programming pass is completed, the data can be read from the memory cells using read reference voltages VrEr/A, VrA/B and VrB/C which are between the Vth distributions. By testing whether the Vth of a given memory cell is above or below one or more of the read reference voltages, the system can determine the data state which is represented by a memory cell.

Figure 7C:
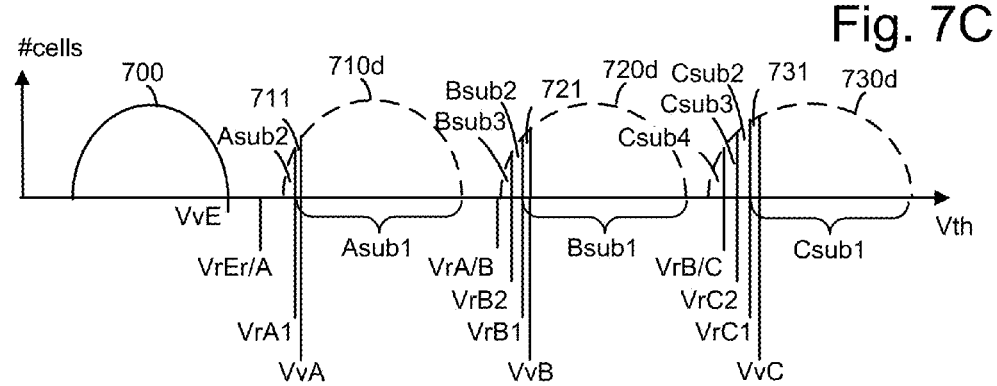
FIG. 7C depicts the Vth distributions of FIG. 7B with Vth downshifts due to charge loss, and control gate voltages used in the sensing of Vth ranges of different subsets of memory cells, consistent with step 603 of FIG. 6A.

FIG. 7C depicts the Vth distributions of FIG. 7B with Vth downshifts due to charge loss, and control gate voltages used in the sensing of Vth ranges of different subsets of memory cells, consistent with step 603 of FIG. 6A. The A, B and C states are represented by Vth distributions 710d, 720d and 730d, respectively. Generally, charge loss lowers the Vth distribution, including the upper and lower tails, of memory cells of a target data state. See also FIG. 16A-16C.

The memory cells of the C state are in a first subset (Csub1) if Vth>VrC1, a second subset (Csub2) if VrC2<Vth<VrC1, a third subset (Csub3) if VrB/C<Vth<VrC2 or a fourth subset (Csub4) if Vth<VrB/C.

Note that a read level which distinguishes between adjacent data states can optionally be used as a boundary of a subset as well, as is done here. For example, VrB/C is an upper boundary of Csub4 and a lower boundary of Csub3. A portion 731 of the Vth distribution 730d represents the memory cells for which VrC1<Vth<VvC, where these cells are not refresh programmed, in one approach. Optionally, FIG. 7C could be modified by merging VrC1 with VvC. A similar merging could occur with the other states.

The memory cells of the B state are in a first subset (Bsub1) if VrB1<Vth<VrB/C, a second subset (Bsub2) if VrB2<Vth<VrB1 or a third subset (Bsub3) if VrA/B<Vth<VrB2. A fourth subset could also be defined for B state cells for which Vth<VrA/B. A portion 721 of the Vth distribution 720d represents the memory cells for which VrB1<Vth<VvB, where these cells are not refresh programmed, in one approach.

The memory cells of the A state are in a first subset (Asub1) if VrA1<Vth<VrA/B or a second subset (Asub2) if VrE/A<Vth<VrA1. A third subset could also be defined for A state cells for which Vth<VrE/A. A portion 711 of the Vth distribution 710d represents the memory cells for which VrA1<Vth<VvA, where these cells are not refresh programmed, in one approach. The Er state cells are not refresh programmed.

For one target data state (e.g., C), the sensing operations identify, in the set of memory cells, at least first, second and third subsets of memory cells, where the first subset of memory cells is in a first threshold voltage range (VrC1 and higher) which encompasses the initial verify voltage (VvC) and a range of voltages (VrC1–VvC) below the initial verify voltage, the second subset of memory cells is in a second threshold voltage range (VrC2–VrC1) below the first threshold voltage range, and the third subset of memory cells is in a third threshold voltage range (VrB/C–VrC2) below the second threshold voltage range. In this case, refresh programming is performed for the second and third subsets of memory cells but not for the first subset of memory cells. A fourth subset of memory cells can be in a fourth threshold voltage range (below VrB/C) which is below the third threshold voltage range, where the fourth subset of memory cells is corrected using error correction code decoding and is refresh programmed.

Figure 7D:
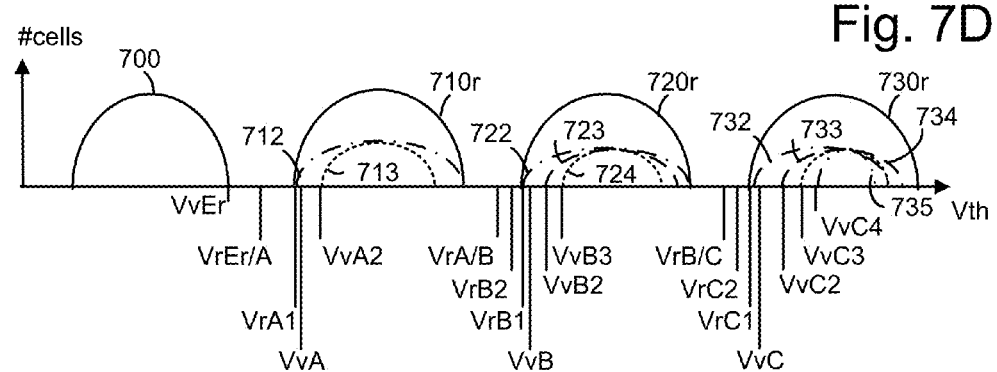
FIG. 7D depicts the Vth distributions of FIG. 7C with Vth upshifts due to refresh programming consistent with step 604 of FIG. 6A.

FIG. 7D depicts the Vth distributions of FIG. 7C with Vth upshifts due to refresh programming consistent with step 604 of FIG. 6A. For each target data state, the first subset is not refresh programmed and the others subsets are refresh programmed, in one approach. For the C state, the Vth distributions 732, 733, 734 and 735 represent the memory cells of the first, second, third and fourth subsets, Csub1, Csub2, Csub3 and Csub4, respectively. For the B state, the Vth distributions 722, 723 and 724 represent the memory cells of the first, second and third subsets, Bsub1, Bsub2 and Bsub3, respectively. For the A state, the Vth distributions 712 and 713 represent the memory cells of the first and second subsets, Asub1 and Asub2, respectively.

The threshold voltage (Vth) upshift of a subset of memory cells can be characterized in different ways. For example, the Vth can upshift can be characterized by the difference between a Vth associated with refresh programming (e.g., a verify voltage used for the refresh programming, or an average or midpoint of the Vth distribution after the refresh programming) and a Vth associated with the subset before the refresh programming (e.g., a read voltage which is a lower or upper boundary of the Vth range of the subset, or a midpoint or average value of the Vth range).

For example, for the memory cells of the C state, a threshold voltage upshift (e.g., VvC3–VrB/C) of the third subset of memory cells due to the refresh programming for the third subset of memory cells is larger than a threshold voltage upshift (e.g., VvC2–VrC2) of the second subset of memory cells due to the refresh programming for the second subset of memory cells. The threshold voltage upshift for a subset is the amount by which the Vth of the memory cells in the subset increases due to the refresh programming Even if the refresh programming of the second and third subsets used the same verify voltage, e.g., VvC2, the threshold voltage upshift (e.g., VvC2−VrB/C) of the third subset of memory cells due to the refresh programming for the third subset of memory cells is larger than the threshold voltage upshift (e.g., VvC2−VrC2) of the second subset of memory cells due to the refresh programming for the second subset of memory cells.

For the memory cells of the C state, a threshold voltage upshift (e.g., VvC4−VrB/C+delta, where delta is non-zero) of the fourth subset of memory cells due to the refresh programming for the fourth subset of memory cells is larger than the threshold voltage upshift of the third subset of memory cells due to the refresh programming for the third subset of memory cells.

For the memory cells of the B state, a threshold voltage upshift (e.g., VvB3−VrA/B) of the third subset of memory cells due to the refresh programming for the third subset of memory cells is larger than a threshold voltage upshift (e.g., VvB2−VrB2) of the second subset of memory cells due to the refresh programming for the second subset of memory cells.

The example of FIG. 7D shows the case where the refresh programming uses verify voltages, consistent with step 604A of FIG. 6A. Moreover, a different verify voltage is associated with each subset. For the C state, verify voltages of VvC2, VvC3 and VvC4 are used in the refresh programming of subsets Csub2, Csub3 and Csub4, respectively. Thus, the verify voltage can be relatively higher when the Vth range of the subset is relatively lower. This approach provides an extra Vth increase for the memory cells which are most likely to have a relatively large amount of charge loss, so that their Vth does not downshift excessively at the time of the next data retention check. Moreover, the time until the next data retention check can be delayed, compared to the case where there is not an extra Vth increase for the memory cells which are most likely to have a relatively large amount of charge loss.

The verify voltage for each subset can be optimized. It should not be too high so as to cause widening of the upper tail of the Vth distribution, or too low so as to allow excessive charge loss before a next data retention check. Alternatively, a common verify voltage can be used for the subsets of a target data state. For example, VvC2 can be used in the refresh programming of Csub2, Csub3 and Csub4. In this example, VvC2 exceeds VvC, the initial verify voltage used during programming. This helps reduce the amount of Vth downshift below VvC at the time of the next data retention check. Due to the refresh programming, a narrower Vth distribution can be achieved and the likelihood of uncorrectable errors due to a long lower tail of the Vth distribution can be reduced.

Alternatively, the refresh programming does not use verify voltages, and is consistent with step 604B of FIG. 6A. In this case, the optimization of the program pulses also provides narrow Vth distributions.

FIGS. 8A and 8B depict a one-pass full programming operation with eight data states, consistent with step 600 of FIG. 6A. In FIG. 8A, a Vth distribution 800 represents the Er state. FIG. 8B depicts a final threshold distribution of the one-pass full programming operation. The Er, A, B, C, D, E, F and G states are represented by the Vth distributions 800, 810, 812, 814, 816, 818, 820 and 822, respectively. A sequence of bits is also depicted for each state in the format of: upper page bit/middle page bit/lower page bit.

FIG. 8C depicts the Vth distributions of FIG. 8B with Vth downshifts due to charge loss, and control gate voltages used in the sensing of Vth ranges of different subsets of memory cells, consistent with step 603 of FIG. 6A. The downshifted A, B, C, D, E, F and G states are represented by the Vth distributions 811, 813, 815, 817, 819, 821 and 823, respectively. The read voltages which distinguish the data states are VrEr/A, VrA/B, VrB/C, VrC/D, VrD/E, VrE/F and VrF/G. Additional read voltages in this example are, VrGs1 and VrGs2 for the G state, VrFs1 and VrFs2 for the F state, VrEs1 and VrEs2 for the E state, VrDs1 for the D state and VrCs1 for the C state. In this example, additional read voltages are not used for the A and B states. Based on the read voltages, a number of subsets can be identified. For example, the G state has first, second, third and fourth subsets for memory cells with Vth>VrGs1, VrGs2<Vth<VrGs1, VrF/G<Vth<VrGs2 and Vth<VvF/G, respectively. The F state has first, second, third and fourth subsets for memory cells with Vth>VrFs1, VrFs2<Vth<VrFs1, VrE/F<Vth<VrFs2 and Vth<VrE/F, respectively. The E state has first, second, third and fourth subsets for memory cells with Vth>VrEs1, VrEs2<Vth<VrEs1, VrD/E<Vth<VrEs2 and Vth<VrD/E, respectively. The D state has first, second and third subsets for memory cells with Vth>VrDs1, VrC/D<Vth<VrDs1 and Vth<VrC/D, respectively. The C state has first, second and third subsets for memory cells with Vth>VrCs1, VrB/C<Vth<VrCs1 and Vth<VrB/C, respectively. The B state has first, second and third subsets for memory cells with Vth>VvB, VrA/B<Vth<VvB and Vth<VrA/B, respectively. The A state has first, second and third subsets for memory cells with Vth>VvA, VrEr/A<Vth<VvA and Vth<VrEr/A, respectively.

In this example, the initial verify voltages of VvA and VvB are used as subset boundaries for the A and B states, respectively, while the initial verify voltages of VvC, VvD, VvE, VvF and VvG are not used as subset boundaries for the C, D, E, F and G states, respectively.

The refresh programming may or may not use verify tests as discussed in connection with the four-state memory device.

FIG. 9 depicts example subsets of memory cells which are classified according to their target data state and an amount of Vth downshift. The set 950 includes memory cells 900-915 and associated bit lines 920-935, respectively. In a simplified example, the various subsets ("sub") are adjacent to one another, and are labelled consistently with FIG. 7C. Memory cells 900-903 are in Esub, a subset which comprises all erased state memory cells. Memory cells 904 and 905 are in Asub1, the first subset of the A state. Memory cells 906 and 907 are in Asub2, the second subset of the A state. Memory cells 908 and 909 are in Bsub1, the first subset of the B state. Memory cell 910 is in Bsub2, the second subset of the B state. Memory cell 911 is in Bsub3, the third subset of the B state. Memory cells 912, 913, 914 and 915 are in Csub1, Csub2, Csub3 and Csub4, the first, second, third and fourth subsets, respectively, of the C state.

As mention, one portion of the memory cells (the first subsets) will not be subject to refresh programming and the other subsets will be subject to refresh programming.

FIG. 10A depicts an example of bit combinations in data latches during a full programming operation consistent with step 600 of FIG. 6A. As mentioned, e.g., in connection with FIG. 1E, a set of data latches can be associated with each bit line and therefore with each memory cell in a set of memory cells connected to a word line. During full programming, Apgm, Bpgm and Cpgm denote bit combinations for a memory cell which is to be programmed to the A, B or C state, respectively. At this time, the latches LDL and UDL store lower and upper page bits, respectively, which identify a target data state. Ainh, Binh and Cinh denote bit combinations for a memory cell which has completed programming to the A, B or C state, respectively, and is to be inhibited from further programming in the programming operation. At this time, the latches LDL and UDL are 1 and 1, respectively, regardless of the target data state. E denotes a bit combination for an erased state memory cell. X denotes a bit whose value does not matter.

FIG. 10B depicts an example of bit combinations in data latches after a sensing operation which classifies the memory cells into subsets, and before a refresh programming operation, consistent with FIG. 6A. When the set of memory cells is sensed in connection with a data retention check, the latches LDL and UDL are updated to identify the target data state of a memory cell. For example, LDL and UDL are 1 and 0, respectively, for the A state cells in Asub1 and Asub2. LDL and UDL are 0 and 0, respectively, for the B state cells in Bsub1, Bsub2 and Bsub3. LDL and UDL are 0 and 1, respectively, for the C state cells in Csub1, Csub2, Csub3 and Csub4. Additionally, the latches Rlsb and Rmsb store two bits of data which identify up to four subsets for a target data state. In this example, Rlsb and Rmsb are 0 and 0, respectively, to identify a first subset (e.g., Asub1, Bsub1 and Csub1) of a target data state. Rlsb and Rmsb are 1 and 0, respectively, to identify a second subset (e.g., Asub2, Bsub2 and Csub2) of a target data state. Rlsb and Rmsb are 0 and 1, respectively, to identify a third subset (e.g., Bsub3 and Csub3) of a target data state. Rlsb and Rmsb are 1 and 1, respectively, to identify a fourth subset (e.g., Csub4) of a target data state.

In FIG. 11A-12C, the horizontal axis depicts time or program loops and the vertical axis depicts Vcg, the voltage on a word line which is selected for full programming or refresh programming.

Figure 11A:
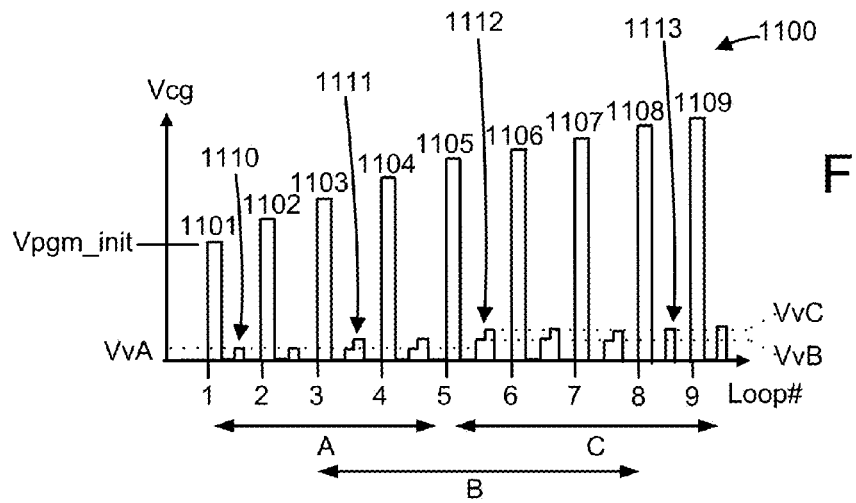
FIG. 11A depicts voltages applied to a word line in an example full programming operation consistent with step 600 of FIG. 6A.

FIG. 11A depicts voltages applied to a word line in an example full programming operation consistent with step 600 of FIG. 6A. A full programming operation programs memory cells from the erased state to different target data states, while a refresh programming operation programs memory cells from a Vth level which is slightly below a target data state due to charge loss which occurs over time, but above the erased state. The programming operation comprises a series of waveforms 1100. Incremental step pulse programming is performed for each target data state. This example also performs verify tests based on the program loop. For example, the A, B and C state cells are verified in loops 1-4, 3-7 and 5-9, respectively. An example verify waveform 1110 comprises an A state verify voltage at VvA. An example verify waveform 1111 comprises A and B state verify voltages at VvA and VvB, respectively. An example verify waveform 1113 comprises B and C state verify voltages at VvB and VvC, respectively. An example verify waveform 1114 comprises a C state verify voltage at VvC. The program pulses 1101-1109 are also depicted. An initial program pulse has the magnitude of Vpgm_init. A program pulse is a waveform that increases from an initial value, e.g., 0 V, to a peak value, in one or more steps, and then back to the initial value, typically.

Figure 11B:
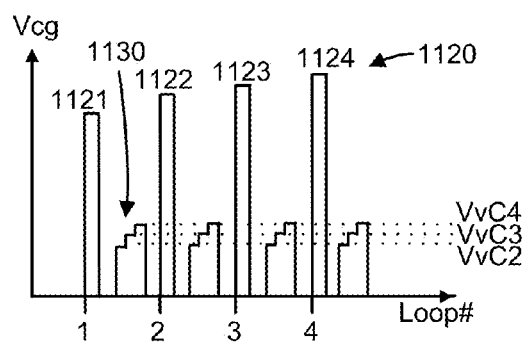
FIG. 11B depicts voltages applied to a word line in an example refresh programming operation consistent with step 604a of FIG. 6A, where one or more program pulses are applied until a verify test is passed for different subsets of C state memory cells.

FIG. 11B depicts voltages applied to a word line in an example refresh programming operation consistent with step 604a of FIG. 6A, where one or more program pulses are applied until a verify test is passed for different subsets of C state memory cells. In one approach, memory cells with different target data states are refresh programmed separately. For example, the C state cells can be refresh programmed, followed by the B state memory cells and then the A state memory cells. The magnitude of the initial program pulse and the step size and duration can be optimized for each target data state. Typically, the magnitude of the initial program pulse is relatively higher when the target data state is relatively higher. The refresh programming operation for the C state comprises a series of waveforms 1120. Incremental step pulse programming is performed. The waveforms includes program pulses 1121-1124. An example verify waveform 1130 comprises verify voltages VvC2, VvC3 and VvC4 for the second, third and fourth subsets, respectively, of the C state.

Figure 11C:
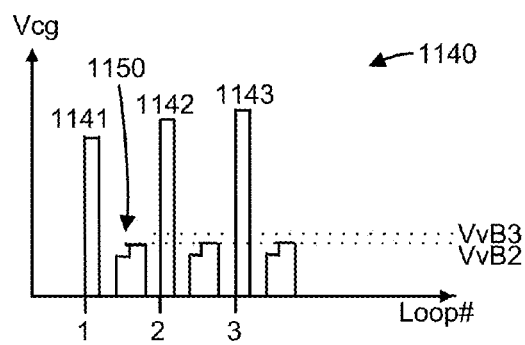
FIG. 11C depicts voltages applied to a word line in an example refresh programming operation consistent with step 604a of FIG. 6A, where one or more program pulses are applied until a verify test is passed for different subsets of B state memory cells.

FIG. 11C depicts voltages applied to a word line in an example refresh programming operation consistent with step 604a of FIG. 6A, where one or more program pulses are applied until a verify test is passed for different subsets of B state memory cells. The refresh programming operation for the B state comprises a series of waveforms 1140. Incremental step pulse programming is performed. The waveforms includes program pulses 1141-1143. An example verify waveform 1150 comprises verify voltages VvB2 and VvB3 for the second and third subsets, respectively, of the B state.

Figure 11D:
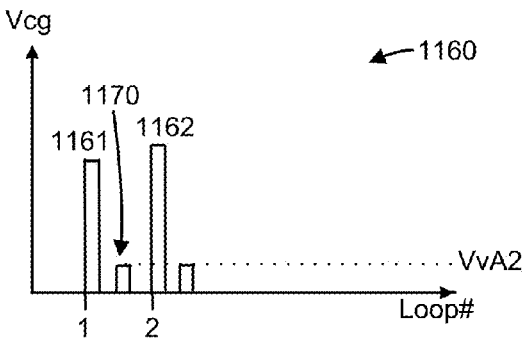
FIG. 11D depicts voltages applied to a word line in an example refresh programming operation consistent with step 604a of FIG. 6A, where one or more program pulses are applied until a verify test is passed for a subset of A state memory cells.

FIG. 11D depicts voltages applied to a word line in an example refresh programming operation consistent with step 604a of FIG. 6A, where one or more program pulses are applied until a verify test is passed for a subset of A state memory cells. The refresh programming operation for the A state comprises a series of waveforms 1160. Incremental step pulse programming is performed. The waveforms includes program pulses 1161 and 1162. An example verify waveform 1170 comprises verify voltages VvA2 for the second subset of the A state.

Note that the number of subsets for a data state can be set adaptively based on the Vth distribution of the cells of that data state. For example, FIG. 7C shows that the bottom of the lower tail of the A state Vth distribution is above VrEr/A so that no cells have Vth<VrEr/A. Accordingly, there is no need for a subset for memory cells of the A state for which Vth<VrEr, and the waveforms for refresh programming for the A state do not need to use a verify voltage which is specific to such a subset. However, another data retention check may show that the lower tail of the A state Vth distribution is below VrEr/A, so that a (third) subset should be defined for memory cells of the A state with Vth<VrEr/A, and the waveforms for refresh programming can use a verify voltage which is specific to this third subset.

FIG. 12A1 depicts voltages applied to a word line in an example refresh programming operation consistent with step 604b of FIG. 6A, where a fixed number of program pulses are applied to refresh program subsets of C state memory cells. As mentioned, the number, magnitude and/or duration of the program pulses can be set to provide a desired upshift in Vth for memory cells of a target data state. If the number, magnitude and/or duration of the program pulses is too small, the upshift in the Vth of the memory cells may be too small, so that the Vth distribution has a substantial lower tail. If the number, magnitude and/or duration of the program pulses is too large, the upshift in the Vth of the memory cells may be too great, so that the upper tail of the Vth distribution is increased and the Vth distribution will be broadened. Testing can be performed to optimize the number, magnitude and/or duration of the program pulses for each target data state.

The waveforms 1200 include first, second and third program pulses 1201, 1202 and 1203, respectively. Different groups of subsets of the C state are programmed during each program pulse. For example, Csub2, Csub3 and Csub4 are programmed during the first program pulse, Csub3 and Csub4 are programmed during the second program pulse, and Csub4 are programmed during the third program pulse. In other words, Csub1 is inhibited (e.g., by raising the associated bit line voltage) from being programmed during the first program pulse, Csub1 and Csub2 are inhibited from being programmed during the second program pulse, and Csub1, Csub2 and Csub3 are inhibited from being programmed during the third program pulse.

Moreover, in this example and in FIGS. 12A2 and 12B, the program pulses have a common magnitude, e.g., within +/−5-10% of one another. By avoiding a step up of the program pulse magnitude, the likelihood of program disturb is reduced, since program disturb is proportional to program pulse magnitude. Alternatively, the program pulses could step up in magnitude with each successive program loop. Generally, the number of program pulses will be small.

Avoiding the use of verify voltages during refresh programming saves time and reduces power consumption. The overall time used for refresh programming can be less than for full sequence programming if the number, magnitude and/or duration of the program pulses is set optimally.

In this example, the performing the refresh programming for the second subset of memory cells (Csub2) comprises programming each memory cell of the second subset of memory cells using a first program pulse 1201 and without performing an associated verify test or further programming of the second subset of memory cells, and the performing the refresh programming for the third subset of memory cells (Csub3) comprises programming each memory cell of the third subset of memory cells using the first program pulse 1201 and a second program pulse 1202 and without performing an associated verify test or further programming of the third subset of memory cells.

FIG. 12A2 depicts voltages applied to a word line in an example refresh programming operation consistent with steps 604a and 604b of FIG. 6A, where a fixed number of program pulses are applied to refresh the subsets Csub2 and Csub3 of the C state memory cells, and one or more program pulses are applied until a verify test is passed for the subset Csub3 of the C state memory cells. This approach uses a fixed number of program pulses without a verify test for one or more subsets (e.g., Csub2 and Csub3) which experience a relatively small Vth upshift during refresh programming, and an adaptive number of program pulses with a verify test for one or more other subsets (e.g., Csub4) which experience a relatively large Vth upshift during refresh programming. When the upshift in Vth is relatively large, there is a relatively wider range of Vth levels which a memory cell is likely to reach when a program pulse is applied. The use of a verify test for these memory cells can result in a narrower range of Vth levels after the refresh programming for these memory cells. This hybrid approach saves time and reduces power consumption compared to the case where a verify test is used for all subsets which are refreshed programmed.

The waveforms 1210 include first, second, third and fourth program pulses 1204, 1205, 1206 and 1207, respectively, and associated verify voltage pulses 1211, 1212, 1213 and 1214, respectively, at VvC4. Different groups of subsets of the C state are programmed during each program pulse. For example, Csub2, Csub3 and Csub4 are programmed during the first program pulse, Csub3 and Csub4 are programmed during the second program pulse, and Csub4 are programmed during the third and fourth program pulses. A fourth program pulse may be needed, for example, to program relatively a slow-programming memory cell in Csub4.

FIG. 12B depicts voltages applied to a word line in an example refresh programming operation consistent with step 604b of FIG. 6A, where a fixed number of program pulses are applied to refresh program subsets of B state memory cells. The waveforms 1220 include first and second program pulses 1221 and 1222, respectively. Different groups of subsets of the B state are programmed during each program pulse. For example, Bsub2 and Bsub3 are programmed during the first program pulse, and Bsub3 is programmed during the second program pulse. In other words, Bsub1 is inhibited from being programmed during the first program pulse, and Bsub1 and Bsub2 are inhibited from being programmed during the second program pulse.

FIG. 12C depicts voltages applied to a word line in an example refresh programming operation consistent with step 604b of FIG. 6A, where a fixed number of program pulses are applied to refresh program a subset of A state memory cells. This example uses a single program pulse 1240 to program memory cells in Asub2 while inhibiting programming of memory cells in Asub1.

FIGS. 13A-13C show a time line in which time progresses by moving to the right.

FIG. 13A depicts a timeline showing times when a data retention check is performed as a function of a time after completion of a full programming operation at time=0. For instance, memory cells of all target data states may be refresh programmed in the same refresh programming operation. The data retention check comprises sensing operations and refresh programming operations. In one approach, described by the dotted-line squares, the data retention check occurs at uniform time intervals after completion of the full programming operation. In another approach, described by the solid-line squares, the data retention check occurs at progressively shorter time intervals after completion of the full programming operation.

FIG. 13B depicts a timeline showing times when a data retention check is performed as a function of a cumulative time above a threshold temperature. In this approach, the data retention check occurs each time a temperature in the memory device exceeds a threshold temperature for a specified cumulative amount of time. The amount of charge loss can increase as a function of an increasing temperature, so that the cumulative amount of time above a threshold temperature is a good indicator of when a data retention check should be performed.

FIG. 13C depicts timelines showing times when a data retention check is performed as a function of a time after completion of a full programming operation, where memory cells of different target data states are refresh programmed in different refresh programming operations. The amount of charge loss can be larger for memory cells in relatively higher data states, so that a data retention check can be performed with a greater frequency for these memory cells. For example, in a given time period represented by the timelines, a data retention check occurs four times in the timeline 1310 for the C state, two times in the timeline 1312 for the B state, and once for in the timeline 1314 for the A state.

A set of executable instructions can be provided to implement the timelines 1310, 1312 and 1314. The set of instructions can include instructions for determining that a first criterion is met for checking a data retention of a relatively higher target data state (e.g., C state) among the plurality of target data states; instructions for, when the first criterion is met, identifying, and performing refresh programming for, memory cells which were programmed to the relatively higher target data state; instructions for determining that a second criterion is met for checking a data retention of a relatively low target data state (e.g., A state) among the plurality of target data states, wherein the second criterion is met less frequently than the first criterion is met; and instructions for, when the second criterion is met, identifying, and performing refresh programming for, memory cells which were programmed to the relatively low target data state. For example, the first criterion may be met four times while the second criterion is met only once during the time period of the timelines.

FIG. 14A is plot showing a time until a next data retention check as a function of a metric of a downshift in Vth, consistent with decision step 601 of FIG. 6A. For example, the metric of the downshift in Vth can be based on a count of memory cells in one or more subsets which encompass the lower tail of the Vth distribution for memory cells of a target data state. The downshift is greater when the count is greater. The time until the next data retention check can therefore be smaller when the downshift is greater. This allows refresh programming to occur before the Vth downshift results in uncorrectable errors. The method thus includes determining a time until a next check of data retention for the set of memory cells, wherein the time is relatively longer when a number of memory cells of the third subset, for instance, of memory cells is relatively smaller.

FIG. 14B is plot showing a time until a next data retention check as a function of a target data state, consistent with decision step 601 of FIG. 6A and with FIG. 13C. The Vth downshift can be greater for higher data states, so that the time until a next data retention check for a target data state can be relatively smaller when the target data state is relatively higher.

FIG. 14C is plot showing a Vth upshift during refresh programming as a function of a sensed Vth downshift, for an example subset of memory cells, consistent with step 604 of FIG. 6A. As mentioned, the amount of Vth downshift of a memory cell can be defined according to the Vth range of the subset into which it is classified. When the amount of downshift is relatively greater, the amount of Vth upshift during refresh programming can be relatively greater. This helps provide a narrow Vth distribution for a target data state after refresh programming.

Figure 14D:
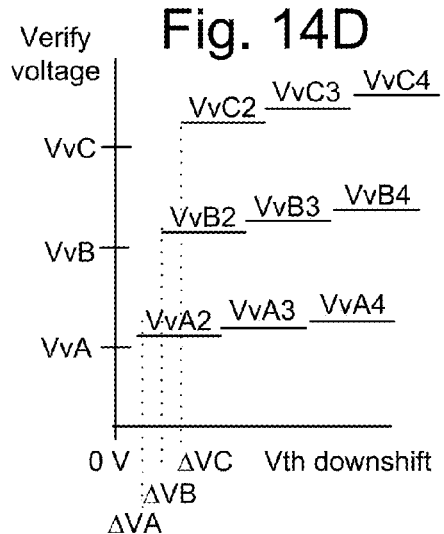
FIG. 14D is plot showing a verify voltage during refresh programming as a function of a sensed Vth downshift, for different target data states, where each target data state has three subsets being refresh programmed, consistent with step 604A of FIG. 6A.
Figure 14E:
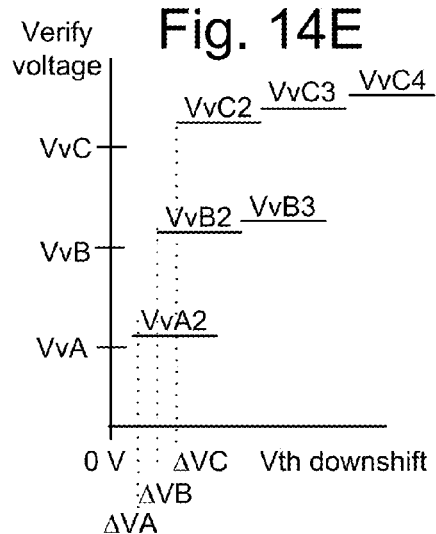
FIG. 14E is plot showing a verify voltage during refresh programming as a function of a sensed Vth downshift, for different target data states, where the C state has three subsets being refresh programmed, the B state has two subsets being refresh programmed, and the A state has one subset being refresh programmed, consistent with step 604A of FIG. 6A and FIG. 7D.

FIG. 14D is plot showing a verify voltage during refresh programming as a function of a sensed Vth downshift, for different target data states, where each target data state has three subsets being refresh programmed, consistent with step 604A of FIG. 6A. In FIGS. 14D and 14E, the horizontal axis represents an amount of Vth downshift for a memory cell, e.g., as defined according to the Vth range of the subset into which it is classified. ΔVA, ΔVB and ΔVC are voltage margins below VvA, VvB and VvC, respectively, which are included as part of the first subset of memory cells of the A, B and C states, respectively, which are not subject to refresh programming. As mentioned, providing such a non-zero margin avoids refresh programming of memory cells which have a minor amount of Vth downshift. This reduces the time and power consumption during refresh programming. Moreover, this margin can be larger for higher data states (e.g., ΔVC>ΔVB>ΔVA) since the memory cells of the higher data states may experience a greater amount of Vth downshift. This approach can result in a roughly equal portion of memory cells in each target data state not being subject to refresh programming.

In FIGS. 14D and 14E, the vertical axis represents a verify voltage during refresh programming. The initial verify voltages VvA, VvB and VvC during full programming are depicted for reference.

In FIG. 14D, each target data state has three subsets of memory cells which are refresh programmed using respective verify voltages. For example, the A state has verify voltages of VvA2 (e.g., as depicted in FIG. 7D), VvA3 and VvA4 (not depicted in FIG. 7D). The B state has verify voltages of VvB2 and VvB3 (e.g., as depicted in FIG. 7D) and VvB4 (not depicted in FIG. 7D). The C state has verify voltages of VvC2, VvC3 and VvC4 (e.g., as depicted in FIG. 7D). As mentioned, it can be helpful to use a verify voltage during refresh programming which is above the initial verify voltage. For example, the lowest verify voltage during refresh programming can exceed the initial verify voltage for each target data state (e.g., VvA2>VvA, VvB2>VvB and VvC2>VvC). Optionally, the amount by which the lowest verify voltage during refresh programming exceeds the initial verify voltage for each target data state can be a function of the target data state. For example, the amount by which the lowest verify voltage during refresh programming exceeds the initial verify voltage can be relatively larger when the target data state is relatively higher (e.g., VvC2−VvC>VvB2−VvB>VvA2−VvA). This helps provide an additional upshift for the memory cells of the higher states which are more likely to experience charge loss.

Optionally, the amount by which the lowest verify voltage during refresh programming exceeds the initial verify voltage is the same for all target data states.

FIG. 14E is plot showing a verify voltage during refresh programming as a function of a sensed Vth downshift, for different target data states, where the C state has three subsets being refresh programmed, the B state has two subsets being refresh programmed, and the A state has one subset being refresh programmed, consistent with step 604A of FIG. 6A and FIG. 7D. Thus, the number of subsets which are refresh programmed is a function of target data state. In particular, the number of subsets which are refresh programmed is relatively higher for a target data state which is relatively higher. See also FIG. 14G. The A state has a verify voltage of VvA2, the B state has verify voltages of VvB2 and VvB3, and the C state has verify voltages of VvC2, VvC3 and VvC4.

FIG. 14E indicates that a control circuit can be configured to: (a) perform a full programming operation involving the set of memory cells, the full programming operation programs memory cells to a plurality of target data states (A, B, C), the plurality of target data states comprise a relatively high target data state having an associated verify voltage (VvC) and a relatively low target data state having an associated verify voltage (VvA); (b) determine that a criterion is met for checking a data retention of the set of memory cells; (c) when the criterion is met: (a) identify a number N1>1 of subsets of memory cells which were programmed to the relatively high target data state and which have a threshold voltage below the verify voltage of the relatively high target data state, each subset of the N1 subsets is associated with a different threshold voltage range among N1 adjacent threshold voltage ranges, and (a) identify a number N2>=1 of subsets of memory cells which were programmed to the relatively low target data state and which have a threshold voltage below the verify voltage of the relatively low target data state, wherein N2<N1; (d) perform refresh programming for the N2 subsets of memory cells; and (e) perform refresh programming for each subset of the N1 subsets of memory cells which were programmed to the relatively high target data state.

For example, the C state may be the relatively high target data state, where N1=3, and the A state may be the relatively low target data state, where N2=1.

Moreover, the number N1 of subsets of memory cells which were programmed to the relatively high target data state is proportional to a relative position of the relatively high target data state among the plurality of target data states. For example, the C state is the highest state in a four-state memory device, so N1 is relatively high (e.g., 3). The A state is the lowest programmed state in a four-state memory device, so N1 is relatively small (e.g., 1). Additionally, the refresh programming for a lowest subset (e.g., Csub4) of the N1 subsets of memory cells which were programmed to the relatively high target data state uses a verify voltage (e.g., VvC4) which is higher than the verify voltage (VvC) of the relatively high target data state by an amount (VvC4−VvC); and the amount is proportional to a relative position of the relatively high target data state among the plurality of target data states. For example, the C state is the highest programmed state in a four-state memory device, so VvC4−VvC is relatively high. The A state is the lowest programmed state in a four-state memory device, so VvA2−VvA is relatively small.

Figure 14F:
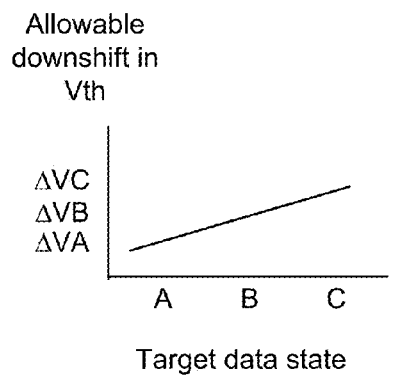
FIG. 14F is plot showing an allowable downshift in Vth without refresh programming, consistent with FIGS. 14D and 14E.

FIG. 14F is plot showing an allowable downshift in Vth without refresh programming, consistent with FIGS. 14D and 14E. As mentioned, the allowable downshift in Vth without refresh programming can be relatively larger when the target data state is relatively higher (e.g., $\Delta VC > \Delta VB > \Delta VA$).

Figure 14G:
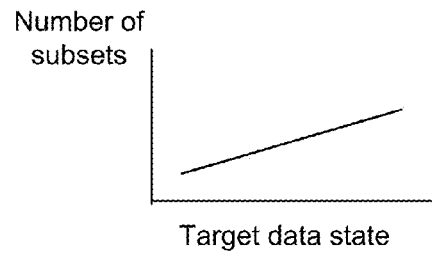
FIG. 14G is plot showing a number of subsets subject to refresh programming, consistent with FIG. 14E.

FIG. 14G is plot showing a number of subsets subject to refresh programming, consistent with FIG. 14E. As seen in FIG. 14E, the number of subsets which are refresh programmed can be relatively higher when the target data state is relatively higher.

Figure 14H:
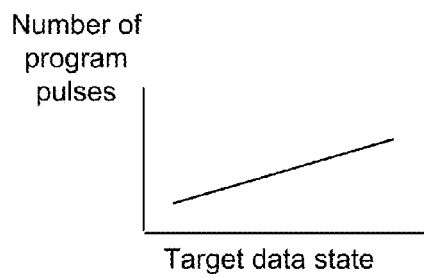
FIG. 14H is plot showing a number of program pulses during refresh programming as a function of a target data state, consistent with step 604B of FIG. 6A.

FIG. 14H is plot showing a number of program pulses during refresh programming as a function of a target data state, consistent with step 604B of FIG. 6A. As seen in FIGS. 12A1, 12B and 12C, a relatively higher number of program pulses can be used for a relatively higher target data state.

Figure 14I:
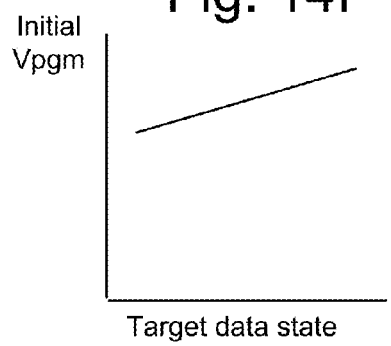
FIG. 14I is plot showing an initial Vpgm during refresh programming as a function of a target data state, consistent with step 604A or 604B of FIG. 6A.

FIG. 14I is plot showing an initial Vpgm during refresh programming as a function of a target data state, consistent with step 604A or 604B of FIG. 6A. As seen in FIGS. 12A1, 12B and 12C, the magnitude of the initial program pulse can be relatively higher for a relatively higher target data state. Or, when all program pulses have a same magnitude during the refresh programming for a target data state, the magnitude of the program pulses can be relatively higher for a relatively higher target data state.

FIG. 15A depicts a circuit diagram of a NAND string consistent with the memory devices of FIGS. 2C and 3C1. An example NAND string NS0A, consistent with FIG. 3C1 (or NS0 consistent with FIG. 2C), includes SGD transistors 1501, 1502 and 1503, a drain-side dummy memory cell 1504, data-storing memory cells 1505, . . . , 1506, a source-side dummy memory cell 1507, and SGS transistors 1508, 1509 and 1510. A bit line 1512 connects the drain end of the NAND string to sensing circuitry 1500, which is used to sense the NAND string during operations involving the select gate transistors and the memory cells. A source line 1511 is connected to a source end of the NAND string. Voltage drivers can be used to provide the voltages depicted. For example, Vsg is applied to the control gates of the SGD transistors, which are optionally connected to one another and to the control gates of the SGS transistors, which are optionally connected to one another. Vsg can also be applied to the dummy memory cells 1504 and 1507. Moreover, assume the set of memory cells which is subject to the data retention check is connected to WLL22. A memory cell 1504 is an example memory cell in the set. During a sensing operation for the set, a control gate voltage Vcgr is applied to WLL22 and a pass voltage, Vpass, is applied to the remaining memory cells, such as the memory cell 1506 connected to WLL0. Vcgr can have different values such as discussed in connection with FIGS. 7C, 7D and 8C. Vbl is the bit line voltage and Vsl is the source line voltage. I_NAND is a sensed current in the NAND string. The current can be sensed during a verify test.

FIG. 15B depicts a circuit diagram of the memory cell 1506 of FIG. 15A. The memory cell includes a number of terminals including a drain (D) terminal which may have a voltage Vbl, a source (S) terminal which may have a voltage Vsl, a control gate (CG) terminal which may have a voltage Vcg and a channel (CH) terminal which may have a voltage Vch.

Figure 16A:
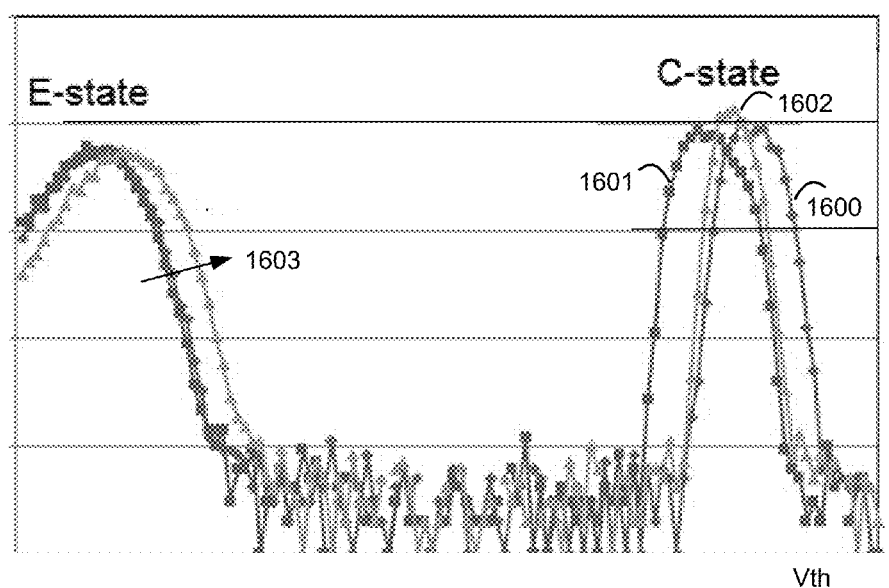
FIG. 16A depicts test data of a set of memory cells in the erased state and the C state, showing an initial Vth distribution 1600 immediately after programming, a downshifted Vth distribution 1601 and a Vth distribution 1602 after full sequence reprogramming.
Figure 16B:
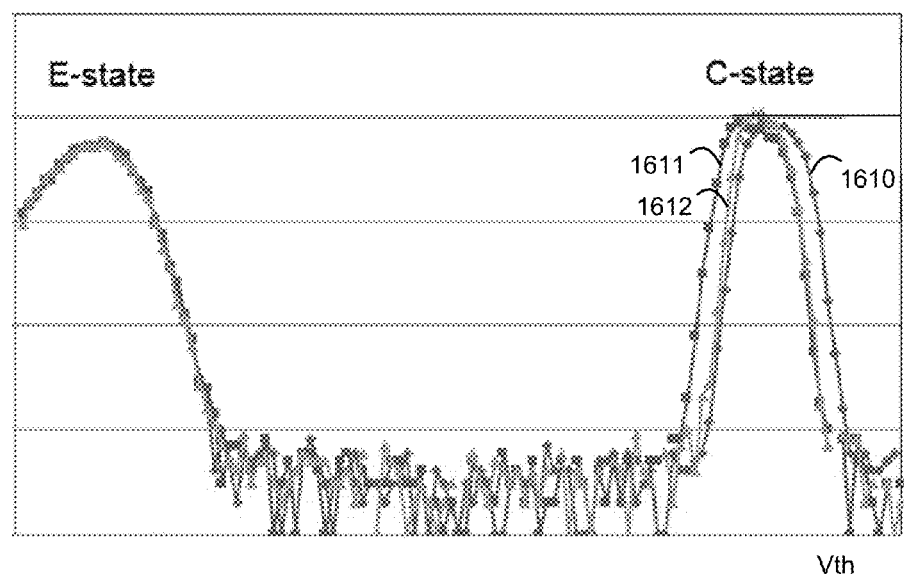
FIG. 16B depicts test data of a set of memory cells in the erased state and the C state, showing an initial Vth distribution 1610 immediately after programming, a downshifted Vth distribution 1611 and a Vth distribution 1612 after refresh programming using a single program pulse.

In FIG. 16A-16C, the horizontal axis represents Vth and the vertical axis represents a number of memory cells, on a logarithmic scale.

FIG. 16A depicts test data of a set of memory cells in the erased state and the C state, showing an initial Vth distribution 1600 immediately after programming, a downshifted Vth distribution 1601 and a Vth distribution 1602 after full sequence reprogramming. The upper and lower tails of the Vth distribution 1601 are lower compared to the Vth distribution 1600. Also, the full sequence reprogramming causes a significant amount of program disturb of the E state memory cells, as shown by the increase in the upper tail of the Vth distribution of the erased state (see arrow 1603).

FIG. 16B depicts test data of a set of memory cells in the erased state and the C state, showing an initial Vth distribution 1610 immediately after programming, a downshifted Vth distribution 1611 and a Vth distribution 1612 after refresh programming using a single program pulse. The single program pulse provides an optimal amount of Vth upshift. Advantageously, there is no program disturb of the E state memory cells, since there is no increase in the upper tail of the Vth distribution of the erased state. The amount of downshift in FIG. 16B is about half that of FIG. 16A.

FIG. 16C depicts test data of a set of memory cells in the erased state and the C state, showing an initial Vth distribution 1620 immediately after programming, a downshifted Vth distribution 1621, a Vth distribution 1622 after refresh programming using one program pulse, and a Vth distribution 1623 after refresh programming using two program pulses. The two program pulses have a common magnitude and provide an optimal amount of Vth upshift. Advantageously, there is no program disturb of the E state memory cells, since there is no increase in the upper tail of the Vth distribution of the erased state. The amount of downshift in FIG. 16C is the same as in FIG. 16A.

The examples of FIG. 16A-16C all have the advantage that the Vth distribution becomes narrow due to the lowering of the upper tail due to charge loss combined with the raising of the upper tail due to refresh programming. However, the refresh programming avoids program disturb and consumes less time compared to the full programming.

Accordingly, it can be seen that, in one embodiment, a method for operating a memory device (100) comprises: performing a full programming operation (1100) involving a set (950) of memory cells (900-915), the full programming operation programs memory cells using an initial verify voltage (VvA, VvB, VvC) of one target data state (A, B, C);

after completion of the full programming operation, making a determination of whether a criterion is met for checking a data retention of the set of memory cells; in response to the determination that the criterion is met, performing sensing operations for memory cells of the one target data state to identify, in the set of memory cells, a plurality of subsets of memory cells comprising first (Asub1, Bsub1, Csub1), second (Asub2, Bsub2, Csub2) and third (Bsub3, Csub3) subsets of memory cells, the first subset of memory cells is in a first threshold voltage range (Vth>VrC1; VrB1<Vth<VrB/C; VrA1<Vth<VrA/B) which encompasses the initial verify voltage (VvC), the second subset of memory cells is in a second threshold voltage range (VrC2<Vth<VrC1; VrB2<Vth<VrB1; VrE/A<Vth<VrA1) below the first threshold voltage range, and the third subset of memory cells is in a third threshold voltage range (VrB/C<Vth<VrC2; VrA/B<Vth<VrB2; Vth<VrE/A) below the second threshold voltage range; and performing refresh programming for the second subset of memory cells and refresh programming for the third subset of memory cells but not for the first subset of memory cells, wherein a threshold voltage upshift (VvC3−VrB/C; VvB3−VrA/B) of the third subset of memory cells due to the refresh programming for the third subset of memory cells is larger than a threshold voltage upshift (VvC2−VrC2; VvB2−VrB2) of the second subset of memory cells due to the refresh programming for the second subset of memory cells.

In another embodiment, a memory device (100) comprises: a set of memory cells (950); and a control circuit (110, 112, 114, 132 116, 122, 128, 192, MC0, SB1, SB2, . . . , SBp). The control circuit is configured to: perform a full programming operation (1100) involving the set of memory cells, the full programming operation programs memory cells to a plurality of target data states (A, B, C), the plurality of target data states comprise a relatively high target data state (C) having an associated verify voltage (VvC) and a relatively low target data state (A) having an associated verify voltage (VvA); determine that a criterion is met for checking a data retention of the set of memory cells; when the criterion is met: (a) identify a number N1>1 of subsets (Csub2, Csub3, Csub4) of memory cells which were programmed to the relatively high target data state and which have a threshold voltage (Vth<VvC) below the verify voltage of the relatively high target data state, each subset of the N1 subsets is associated with a different threshold voltage range (VrC2<Vth<VrC1, VrB/C<Vth<VrC2, Vth<VrB/C) among N1 adjacent threshold voltage ranges, and (a) identify a number N2>=1 of subsets (Asub2) of memory cells which were programmed to the relatively low target data state and which have a threshold voltage (VrE/A<Vth<VrA1) below the verify voltage of the relatively low target data state, wherein N2<N1; perform refresh programming for the N2 subsets of memory cells; and perform refresh programming for each subset of the N1 subsets of memory cells which were programmed to the relatively high target data state.

In another embodiment, a memory controller (122) comprises: a storage device (122a, 122b) comprising a set of instructions (160), and a processor (122c) operable to execute the set of instructions. The set of instructions comprises: instructions (161) for programming a set (950) of memory cells to a plurality of target data states (A, B, C); and instructions (162) for sensing and refresh programming the set of memory cells after the programming and during a time period in which the set of memory cells are not erased. The instructions for sensing and refresh programming comprises: instructions for determining that a first criterion is met for checking a data retention of a relatively higher target data state among the plurality of target data states; instructions for, when the first criterion is met, identifying, and performing refresh programming for, memory cells which were programmed to the relatively higher target data state; instructions for determining that a second criterion is met for checking a data retention of a relatively low target data state among the plurality of target data states, wherein the second criterion is met less frequently than the first criterion is met; and instructions for, when the second criterion is met, identifying, and performing refresh programming for, memory cells which were programmed to the relatively low target data state.

In another embodiment, a memory device comprises: a set (950) of memory cells (900-915); and a control circuit (110, 112, 114, 132 116, 122, 128, 192, MC0, SB1, SB2, . . . , SBp). The control circuit is configured to: perform a full programming operation (1100) involving the set of memory cells, the full programming operation programs memory cells using an initial verify voltage (VvA, VvB, VvC) of one target data state (A, B, C); after completion of the full programming operation, making a determination that a criterion is met for checking a data retention of the set of memory cells; in response to the determination that the criterion is met, perform sensing operations for the memory cells of the one target data state to identify, in the set of memory cells, first (Asub1, Bsub1, Csub1), second (Asub2, Bsub2, Csub2) and third (Bsub3, Csub3) subsets of memory cells, the first subset of memory cells is in a first threshold voltage range (Vth>VrC1; VrB1<Vth<VrB/C; VrA1<Vth<VrA/B) which encompasses the initial verify voltage (VvC), the second subset of memory cells is in a second threshold voltage range (VrC2<Vth<VrC1; VrB2<Vth<VrB1; VrE/A<Vth<VrA1) below the first threshold voltage range, and the third subset of memory cells is in a third threshold voltage range (VrB/C<Vth<VrC2; VrA/B<Vth<VrB2; Vth<VrE/A) below the second threshold voltage range; and perform refresh programming for the second subset of memory cells and refresh programming for the third subset of memory cells, but not for the first subset of memory cells, wherein a threshold voltage upshift (VvC3−VrB/C; VvB3−VrA/B) of the third subset of memory cells due to the refresh programming for the third subset of memory cells is larger than a threshold voltage upshift (VvC2−VrC2; VvB2−VrB2) of the second subset of memory cells due to the refresh programming for the second subset of memory cells.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

What is claimed is:
1. A method for operating a memory device, comprising:
   performing a full programming operation involving a set of memory cells, the full programming operation programs memory cells using an initial verify voltage of one target data state;

after completion of the full programming operation, making a determination of whether a criterion is met for checking a data retention of the set of memory cells;
in response to the determination that the criterion is met, performing sensing operations for memory cells of the one target data state to identify, in the set of memory cells, a plurality of subsets of memory cells comprising first, second and third subsets of memory cells, the first subset of memory cells is in a first threshold voltage range which encompasses the initial verify voltage, the second subset of memory cells is in a second threshold voltage range below the first threshold voltage range, and the third subset of memory cells is in a third threshold voltage range below the second threshold voltage range wherein the identifying the plurality of subsets of memory cells comprises identifying the first subset of memory cells by providing a first bit combination in latches of the first subset of memory cells, identifying the second subset of memory cells by providing a second bit combination in latches of the second subset of memory cells, and identifying the third subset of memory cells by providing a third bit combination in latches of the third subset of memory cells; and
performing refresh programming for the second subset of memory cells and refresh programming for the third subset of memory cells but not for the first subset of memory cells, wherein a threshold voltage upshift of the third subset of memory cells due to the refresh programming for the third subset of memory cells is larger than a threshold voltage upshift of the second subset of memory cells due to the refresh programming for the second subset of memory cells wherein:
the performing the refresh programming for the second subset of memory cells comprises programming each memory cell of the second subset of memory cells using one or more program pulses until the second subset of memory cells passes an associated verify test; and
the performing the refresh programming for the third subset of memory cells comprises programming each memory cell of the third subset of memory cells using one or more program pulses until the third subset of memory cells passes an associated verify test, wherein a verify voltage of the associated verify test of the third subset of memory cells is higher than a verify voltage of the associated verify test of the second subset of memory cells.

2. The method of claim 1, wherein:
the first threshold voltage range encompasses the initial verify voltage and a range of voltages below the initial verify voltage.

3. The method of claim 1, wherein:
the performing the refresh programming for the second subset of memory cells comprises programming each memory cell of the second subset of memory cells using a first program pulse and without performing an associated verify test or further programming of the second subset of memory cells; and
the performing the refresh programming for the third subset of memory cells comprises programming each memory cell of the third subset of memory cells using the first program pulse and a second program pulse and without performing an associated verify test or further programming of the third subset of memory cells.

4. The method of claim 1, wherein:
the performing the refresh programming for the second subset of memory cells comprises programming each memory cell of the second subset of memory cells using a first program pulse and without performing an associated verify test or further programming of the second subset of memory cells.

5. The method of claim 1, wherein:
the performing the refresh programming for the third subset of memory cells comprises programming each memory cell of the third subset of memory cells using one or more program pulses until the third subset of memory cells passes an associated verify test.

6. The method of claim 5, wherein:
the associated verify test of the third subset of memory cells uses a verify voltage (VvA3, VvB3, VvC3) which is higher than the initial verify voltage.

7. The method of claim 6, wherein:
the full programming operation programs memory cells in the set of memory cells to a plurality of target data states; and
the verify voltage of the associated verify test of the third subset of memory cells is higher than the initial verify voltage by an amount which is relatively greater when the one target data state is a relatively higher target data state among the plurality of target data states.

8. The method of claim 1, wherein the plurality of subsets comprises a fourth subset of memory cells, the fourth subset of memory cells is in a fourth threshold voltage range which is below the third threshold voltage range, and the fourth subset of memory cells is corrected using error correction code decoding, the method further comprising:
performing refresh programming for the fourth subset of memory cells, wherein a threshold voltage upshift of the fourth subset of memory cells due to the refresh programming for the fourth subset of memory cells is larger than the threshold voltage upshift of the third subset of memory cells due to the refresh programming for the third subset of memory cells.

9. The method of claim 1, wherein:
the criterion is met for checking the data retention of the memory cells of the one target data state based on passage of a specified time period.

10. The method of claim 1, further comprising:
obtaining a count of memory cells in one or more subsets of the plurality of subsets of memory cells; and
if the count is above a threshold, performing refresh programming for memory cells of another target data state, below the one target data state, in response to the determination that the criterion is met; and
if the count is not above the threshold, not performing refresh programming for the memory cells of another target data state in response to the determination that the criterion is met.

11. A memory device, comprising:
a set of memory cells; and
a control circuit, the control circuit is configured to:
perform a full programming operation involving the set of memory cells, the full programming operation programs memory cells to a plurality of target data states, the plurality of target data states comprise a relatively high target data state having an associated verify voltage and a relatively low target data state having an associated verify voltage;
determine that a criterion is met for checking a data retention of the set of memory cells;

when the criterion is met: (a) identify a number N1>1 of subsets of memory cells which were programmed to the relatively high target data state and which have a threshold voltage below the verify voltage of the relatively high target data state, each subset of the N1 subsets is associated with a different threshold voltage range among N1 adjacent threshold voltage ranges, wherein to identify the number N1>1 of subsets of memory cells the control circuit is configured to update latches of the number N1>1 of subsets of memory cells and (b) identify a number N2>=1 of subsets of memory cells which were programmed to the relatively low target data state and which have a threshold voltage below the verify voltage of the relatively low target data state, wherein N2<N1 and, to identify the number N2>=1 of subsets of memory cells, the control circuit is configured to update latches of the number N2>=1 of subsets of memory cells, wherein N1+N2 is no more than a number of target data states in the plurality of target data states;

perform refresh programming for the N2 subsets of memory cells; and perform refresh programming for each subset of the N1 subsets of memory cells which were programmed to the relatively high target data state; wherein:

the refresh programming for a lowest subset of the N1 subsets of memory cells which were programmed to the relatively high target data state uses a verify voltage which is higher than the verify voltage of the relatively high target data state by an amount; and the amount is proportional to a position of the relatively high target data state among the plurality of target data states.

12. The memory device of claim 11, wherein:

the refresh programming for each subset of the N1 subsets of memory cells which were programmed to the relatively high target data state uses one or more program pulses; and an initial program pulse of the one or more program pulses has a different magnitude for each subset of the N1 subsets.

13. The memory device of claim 11, wherein:

the number N1 of subsets of memory cells which were programmed to the relatively high target data state is proportional to a position of the relatively high target data state among the plurality of target data states.

14. An apparatus, comprising:

a set of memory cells;

latches associated with the set of memory cells means for performing a full programming operation involving the set of memory cells, the full programming operation programs memory cells using an initial verify voltage of one target data state;

means for, after completion of the full programming operation, making a determination of whether a criterion is met for checking a data retention of the set of memory cells;

means for, in response to the determination that the criterion is met, performing sensing operations for memory cells of the one target data state to identify, in the set of memory cells, a plurality of subsets of memory cells comprising first, second and third subsets of memory cells, the first subset of memory cells is in a first threshold voltage range which encompasses the initial verify voltage, the second subset of memory cells is in a second threshold voltage range below the first threshold voltage range, and the third subset of memory cells is in a third threshold voltage range below the second threshold voltage range, wherein the means for performing sensing operations update the latches associated with the set of memory cells to identify the first, second and third subsets of memory cells;

means responsive to the latches for performing refresh programming for the second subset of memory cells and refresh programming for the third subset of memory cells but not for the first subset of memory cells, wherein a threshold voltage upshift of the third subset of memory cells due to the refresh programming for the third subset of memory cells is larger than a threshold voltage upshift of the second subset of memory cells due to the refresh programming for the second subset of memory cells; and means for determining an amount of time until a next check of data retention for the set of memory cells, wherein the amount of time is inversely proportional to a number of memory cells of the third subset of memory cells.

15. A method for operating a memory device, comprising:

performing a full programming operation involving a set of memory cells, the full programming operation programs memory cells using an initial verify voltage of one target data state;

after completion of the full programming operation, making a determination of whether a criterion is met for checking a data retention of the set of memory cells;

in response to the determination that the criterion is met, performing sensing operations for memory cells of the one target data state to identify, in the set of memory cells, a plurality of subsets of memory cells comprising first, second and third subsets of memory cells, the first subset of memory cells is in a first threshold voltage range which encompasses the initial verify voltage, the second subset of memory cells is in a second threshold voltage range below the first threshold voltage range, and the third subset of memory cells is in a third threshold voltage range below the second threshold voltage range wherein the identifying the plurality of subsets of memory cells comprises identifying the first subset of memory cells by providing a first bit combination in latches of the first subset of memory cells, identifying the second subset of memory cells by providing a second bit combination in latches of the second subset of memory cells, and identifying the third subset of memory cells by providing a third bit combination in latches of the third subset of memory cells; and performing refresh programming for the second subset of memory cells and refresh programming for the third subset of memory cells but not for the first subset of memory cells, wherein a threshold voltage upshift of the third subset of memory cells due to the refresh programming for the third subset of memory cells is larger than a threshold voltage upshift of the second subset of memory cells due to the refresh programming for the second subset of memory cells; wherein:

the full programming operation programs memory cells in the set of memory cells to a plurality of target data states;

the sensing operations use a control gate voltage which defines a bottom of a range of the second threshold voltage range; and a difference between the control gate voltage which defines the bottom of the second threshold voltage range and the initial verify voltage is relatively larger when the one target data state is a relatively higher target data state among the plurality of target data states than when the one target data state is a relatively lower target data state among the plurality of target data states.

16. A method for operating a memory device, comprising:

performing a full programming operation involving a set of memory cells, the full programming operation programs memory cells using an initial verify voltage of one target data state;

after completion of the full programming operation, making a determination of whether a criterion is met for checking a data retention of the set of memory cells;

in response to the determination that the criterion is met, performing sensing operations for memory cells of the one target data state to identify, in the set of memory cells, a plurality of subsets of memory cells comprising first, second and third subsets of memory cells, the first subset of memory cells is in a first threshold voltage range which encompasses the initial verify voltage, the second subset of memory cells is in a second threshold voltage range below the first threshold voltage range, and the third subset of memory cells is in a third threshold voltage range below the second threshold voltage range wherein the identifying the plurality of subsets of memory cells comprises identifying the first subset of memory cells by providing a first bit combination in latches of the first subset of memory cells, identifying the second subset of memory cells by providing a second bit combination in latches of the second subset of memory cells, and identifying the third subset of memory cells by providing a third bit combination in latches of the third subset of memory cells; and performing refresh programming for the second subset of memory cells and refresh programming for the third subset of memory cells but not for the first subset of memory cells, wherein a threshold voltage upshift of the third subset of memory cells due to the refresh programming for the third subset of memory cells is larger than a threshold voltage upshift of the second subset of memory cells due to the refresh programming for the second subset of memory cells; wherein:

the criterion is met for checking the data retention of the memory cells of the one target data state based on a temperature sensed in the memory device exceeding a threshold temperature for a specified cumulative amount of time.

* * * * *